(12) United States Patent
Son et al.

(10) Patent No.: US 11,830,441 B2
(45) Date of Patent: Nov. 28, 2023

(54) GATE DRIVER AND DISPLAY DEVICE USING THE SAME

(71) Applicant: LG Display Co., Ltd., Seoul (KR)

(72) Inventors: Ki Won Son, Paju-si (KR); Ki Min Son, Paju-si (KR); Seok Noh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/861,027

(22) Filed: Jul. 8, 2022

(65) Prior Publication Data

US 2023/0010366 A1 Jan. 12, 2023

(30) Foreign Application Priority Data

Jul. 8, 2021 (KR) .................. 10-2021-0090010
Dec. 23, 2021 (KR) .................. 10-2021-0186054

(51) Int. Cl.
*G09G 3/3291* (2016.01)
*G09G 3/3266* (2016.01)

(52) U.S. Cl.
CPC ......... *G09G 3/3291* (2013.01); *G09G 3/3266* (2013.01); *G09G 2300/0842* (2013.01)

(58) Field of Classification Search
CPC .............. G09G 3/3291; G09G 3/3266; G09G 2300/0842; G09G 2300/043; G09G 2300/0819; G09G 2310/0205; G09G 2310/0251; G09G 2310/0286; G09G 2320/029; G09G 3/3233; G11C 19/28
See application file for complete search history.

(56) References Cited

U.S. PATENT DOCUMENTS

| | | | |
|---|---|---|---|
| 11,211,013 B2 | 12/2021 | Kim et al. | |
| 11,227,550 B2 | 1/2022 | Feng et al. | |
| 2017/0132977 A1* | 5/2017 | Kim | .................. G09G 3/3291 |
| 2018/0337682 A1 | 11/2018 | Takasugi et al. | |
| 2020/0135115 A1* | 4/2020 | Chang | .................. G09G 3/3266 |
| 2020/0160781 A1 | 5/2020 | Park | |

FOREIGN PATENT DOCUMENTS

| | | |
|---|---|---|
| CN | 109166527 A | 1/2019 |
| EP | 3754645 A1 | 12/2018 |
| KR | 10-2016-0092173 A | 8/2016 |
| KR | 10-2020-0026474 A | 3/2020 |
| KR | 10-2020-0048784 A | 5/2020 |
| KR | 10-2020-0058206 A | 5/2020 |
| KR | 10-2020-0060941 A | 6/2020 |
| KR | 10-2020-0080783 A | 7/2020 |
| WO | WO 2015083136 A1 | 6/2015 |

OTHER PUBLICATIONS

Office Action, dated Aug. 1, 2023, for Japanese Patent Application No. 2022-110593. (5 pages).

* cited by examiner

*Primary Examiner* — Premal R Patel
(74) *Attorney, Agent, or Firm* — Seed IP Law Group LLP

(57) ABSTRACT

The present disclosure is directed to a gate driver circuit configured to prevent a light-emitting element of a display device from emitting light in a sensing mode. The gate driver circuit allows a plurality of scan lines of the display device being concurrently sensed by pre-charging a node of the gate driver circuit prior starting a sensing mode. The present disclosure provides the benefit of sensing a greater number of pixels of a display in a shorter time while also ensuring that a sufficient charge is provided by the pre-charged node for a plurality of pixels of the plurality of scan lines to be sensed concurrently.

21 Claims, 20 Drawing Sheets

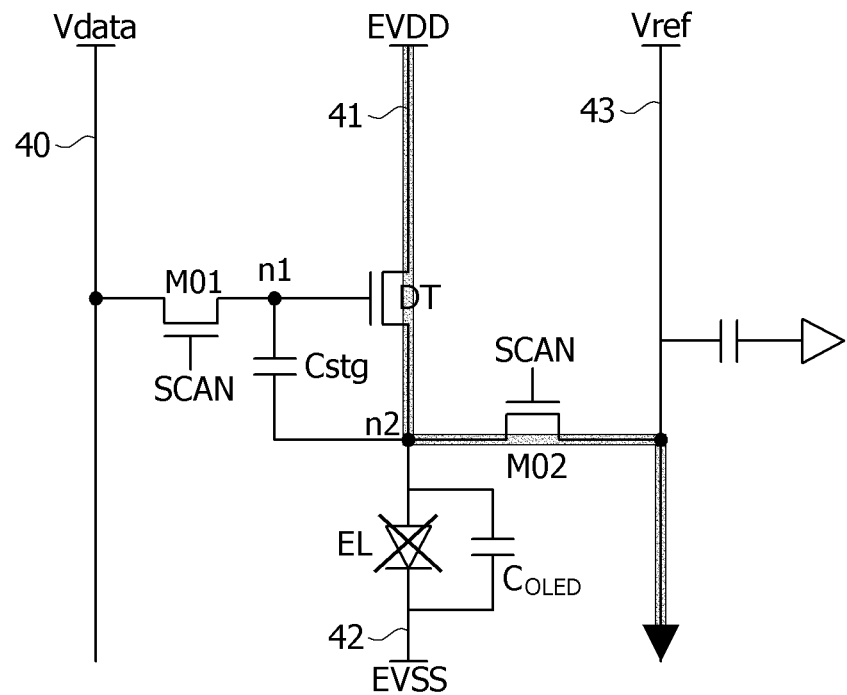
*Fig. 7A1*
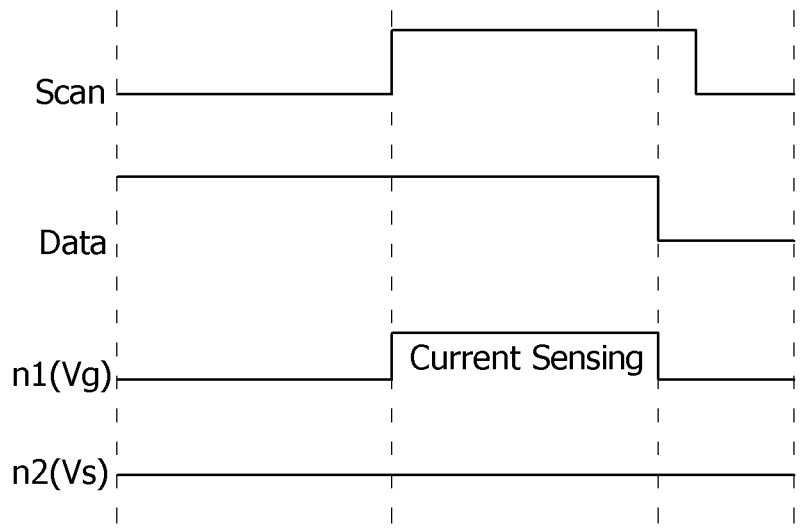
*Fig. 7A2*

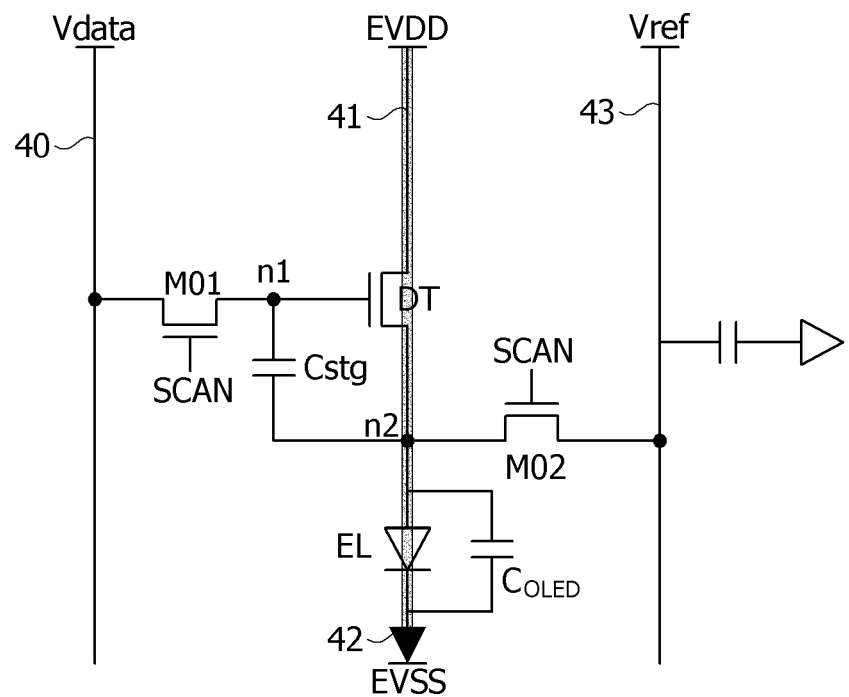
*Fig. 7B1*
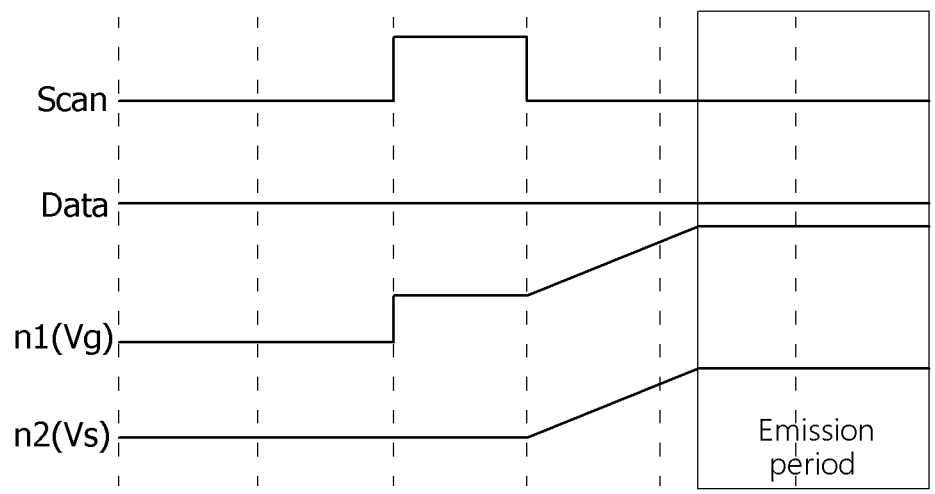
*Fig. 7B2*

GATE DRIVER AND DISPLAY DEVICE USING THE SAME

CROSS-REFERENCE TO RELATED APPLICATION

This application claims priority to and the benefit of Korean Patent Application No. 10-2021-0090010, filed on Jul. 8, 2021, and Korean Patent Application No. 10-2021-0186054, filed on Dec. 23, 2021, the disclosure of which is incorporated herein by reference in its entirety.

BACKGROUND

Technical Field

The present disclosure relates to a gate driver and a display device using the same.

Description of the Related Art

Display devices includes a liquid crystal display (LCD) device, an electroluminescence display device, a field emission display (FED) device, a plasma display panel (PDP), and the like.

Electroluminescent display devices are divided into inorganic light emitting display devices and organic light emitting display devices according to a material of a light emitting layer. An active-matrix type organic light emitting display device reproduces an input image using a self-emissive element which emits light by itself, for example, an organic light emitting diode (hereinafter referred to as an "OLED"). An organic light emitting display device has advantages in that a response speed is fast and luminous efficiency, luminance, and a viewing angle are large.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when a driving signal such as a scan signal, an EM signal, and a data signal is supplied to a plurality of sub-pixels formed in the display panel, the selected sub-pixel transmits light or emits light directly to thereby display an image.

Each sub-pixel includes a driving thin film transistor (TFT) which controls a current flowing through a light-emitting element and one or more switch TFTs which switch the current. In this case, deterioration due to long-time driving of the driving TFT can occur, and a current sensing-based compensation method is applied to compensate for this deterioration.

BRIEF SUMMARY

The inventors have recognized that the sensing-based compensation method now in use operates at a time in which a user is not watching, but there is a disadvantage in that an organic light-emitting diode (OLED) is recognized as a structure emitting light.
The present disclosure is directed to providing a gate driver configured to prevent a light-emitting element from emitting light in a sensing mode. A display device using the same is also disclosed and described in detail.

In the present disclosure, a plurality of scan lines can be simultaneously selected by charging an M node of a signal transmission unit connected to the scan lines to be selected to a high potential voltage before driving in a sensing mode. In one embodiment, a plurality of scan lines are concurrently high, so that each of them can be sensed within a common time frame. Hence the present disclosure benefits sensing a greater area of a display in a shorter time, while a sufficient charge is provided for a plurality of pixels to be sensed concurrently.

In the present disclosure, when driving in the sensing mode, light emission of a light-emitting element is prevented by outputting a scan signal at a high voltage level to sense a current flowing through a pixel driving voltage line while forming a current path using a path which bypasses the light-emitting element. The current that would normally flow through the light emitting element is drawn through the bypass transistor and the voltage at the anode of the diode is kept lower than that threshold voltage of the diode, preventing it from turning on and thus from emitting light.

In the present disclosure, when driving in the sensing mode, since the light emission of the light-emitting element is suppressed, there is no light emitted during the sensing operation. Thus, a sensing operation can be carried out at any time and the undesired generation of light during a sensing operation can be avoided.

Disclosed is a gate driver circuit configured to prevent a light-emitting element of a display device from emitting light in a sensing mode. The gate driver circuit allows a plurality of scan lines of the display device to be concurrently sensed by pre-charging a node of the gate driver circuit prior starting a sensing mode. This provides additional drive power to the output signal of the gate driving circuit used during sensing mode. The present disclosure provides the benefit of sensing a greater number of pixels of a display in a shorter time while also ensuring that a sufficient charge is provided by the pre-charged node for a plurality of pixels of the plurality of scan lines to be sensed concurrently.

A method is also disclosed of concurrently driving a plurality of display lines having multiple pixels on each line. The method includes pre-charging a node in the gate driver circuit that permits and outputting a gate drive signal having additional power.

Effects of the present disclosure are not limited to the effects mentioned above, and other effects not mentioned will be clearly understood by those skilled in the art from the description of the claims.

It should be noted that objects of the present disclosure are not limited to the above-described objects, and other objects of the present disclosure will be apparent to those skilled in the art from the following descriptions.

BRIEF DESCRIPTION OF THE SEVERAL VIEWS OF THE DRAWINGS

The above and other objects, features and advantages of the present disclosure will become more apparent to those of ordinary skill in the art by describing in detail exemplary embodiments thereof with reference to the accompanying drawings, in which:

FIG. 7A1 is a pixel circuit by a bypassed current in a sensing mode according to the embodiment of the present disclosure;

FIG. 7A2 is voltage diagram of different nodes of the pixel circuit in FIG. 7A1 according to the embodiment of the present disclosure;

FIG. 7B1 is a pixel circuit without a bypassed current in a sensing mode according to the embodiment of the present disclosure;

FIG. 7B2 is voltage diagram of different nodes of the pixel circuit in FIG. 7B1 according to the embodiment of the present disclosure;

DETAILED DESCRIPTION

Figure 1:
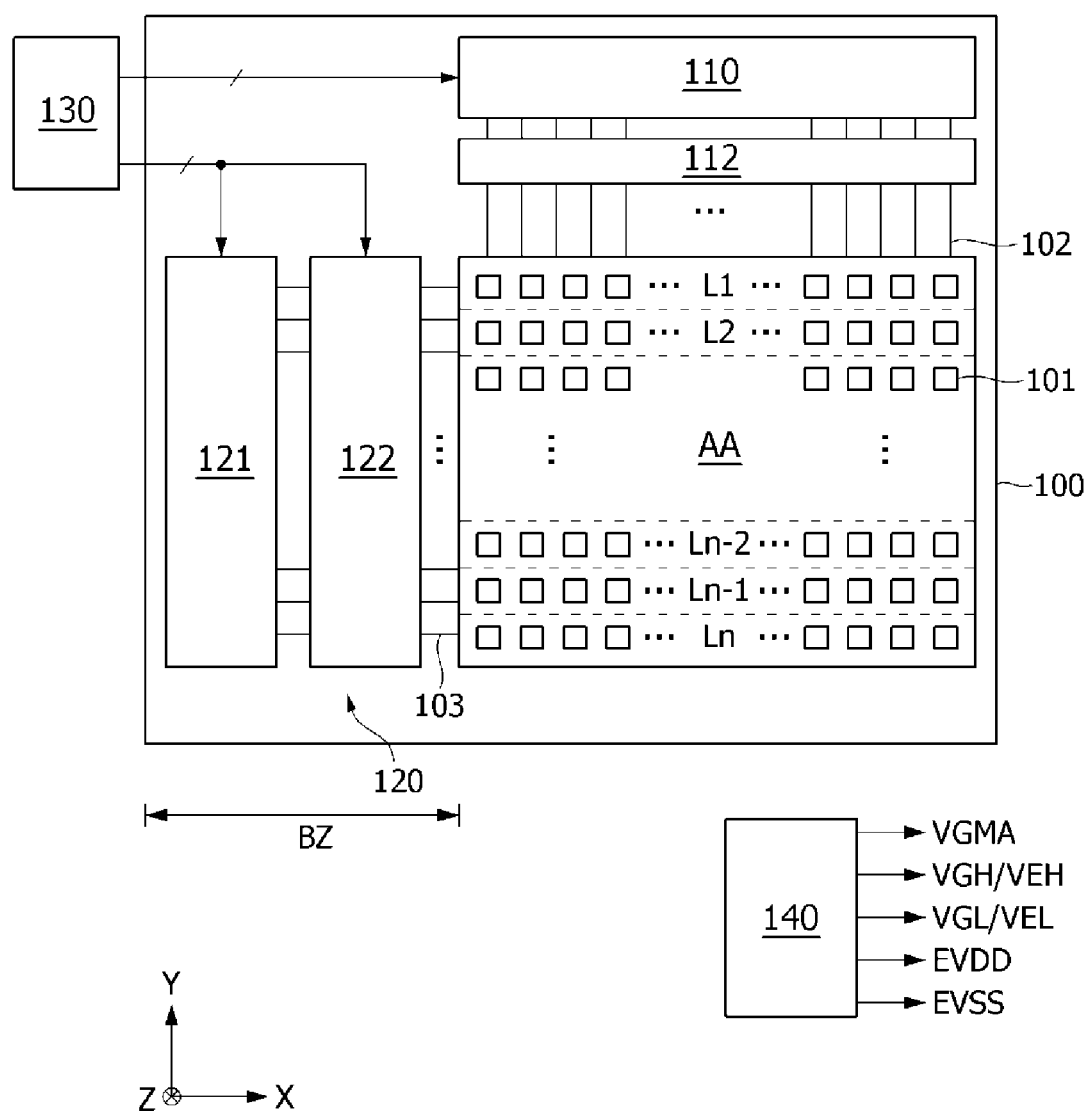
FIG. 1 is a block diagram illustrating a display device according to an embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

As an example, the first node in the claims may correspond to the M node in the embodiment. The second node in the claims may correspond to the first control node in the embodiment. The third node in the claims may correspond to the second control node in the embodiment. The fourth node in the claims may correspond to the Qh node in the embodiment. The fifth node in the claims may correspond to the first node in the embodiment.

As another example, in the claims, the first reference potential node may correspond to the second low potential voltage line in the embodiment. The second reference potential node in the claims may correspond to the third low potential voltage line in the embodiment.

As another example, the first voltage supply in the claims may correspond to the first high potential voltage in the embodiment. The second voltage supply in the claims may correspond to the second high potential voltage in the embodiment.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Figure 2:
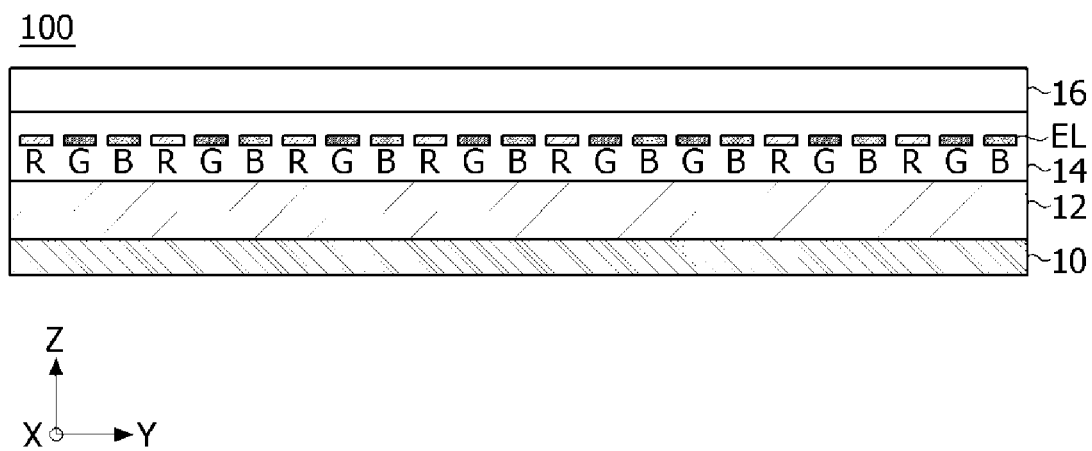
FIG. 2 is a view illustrating a cross-sectional structure of the display panel shown in FIG. 1.

FIG. 1 is a block diagram illustrating a display device according to an embodiment of the present disclosure, and FIG. 2 is a diagram illustrating a cross-sectional structure of the display panel shown in FIG. 1.

Referring to FIGS. 1 and 2, the display device according to an embodiment of the present disclosure includes a display panel 100, a display panel driver for writing pixel data to pixels of the display panel 100, and a power supply 140 for generating power necessary for driving the pixels and the display panel driver.

The display panel 100 may be a display panel having a rectangular structure having a length in an X-axis direction, a width in a Y-axis direction, and a thickness in a Z-axis direction. The display panel 100 includes a pixel array AA that displays an input image. The pixel array AA includes a plurality of data lines 102, a plurality of gate lines 103 intersected with the data lines 102, and pixels arranged in a matrix form. The display panel 100 may further include power lines commonly connected to pixels. The power lines may include a power line to which a pixel driving voltage ELVDD is applied, a power line to which an initialization voltage Vinit is applied, a power line to which a reference voltage Vref is applied, and a power line to which a low potential power voltage ELVSS is applied. These power lines are commonly connected to the pixels.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share the gate lines 103. Sub-pixels arranged in a column direction Y along a data line direction share the same data line 102. One horizontal period 1H is a time obtained by dividing one frame period by the total number of pixel lines L1 to Ln.

The display panel 100 may be implemented as a non-transmissive display panel or a transmissive display panel. The transmissive display panel may be applied to a transparent display device in which an image is displayed on a screen and an actual background may be seen.

The display panel 100 may be implemented as a flexible display panel. The flexible display panel may be made of a plastic OLED panel. An organic thin film may be disposed on a back plate of the plastic OLED panel, and the pixel array AA and light emitting element may be formed on the organic thin film.

To implement color, each of the pixels 101 may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels includes a pixel circuit. The pixel circuit is connected to the data line, the gate line and power line.

The pixels may be arranged as real color pixels and pentile pixels. The pentile pixel may realize a higher resolution than the real color pixel by driving two sub-pixels having different colors as one pixel 101 using a preset pixel rendering algorithm. The pixel rendering algorithm may compensate for insufficient color representation in each pixel with a color of light emitted from an adjacent pixel.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

As shown in FIG. 2, when viewed from a cross-sectional structure, the display panel 100 may include a circuit layer 12, a light emitting element layer 14, and an encapsulation layer 16 stacked on a substrate 10.

The circuit layer 12 may include a pixel circuit connected to wirings such as a data line, a gate line, and a power line, a gate driver (GIP) connected to the gate lines, and the like. The wirings and circuit elements of the circuit layer 12 may include a plurality of insulating layers, two or more metal layers separated with the insulating layer therebetween, and an active layer including a semiconductor material.

The light emitting element layer 14 may include a light emitting element EL driven by a pixel circuit. The light emitting element EL may include a red (R) light emitting element, a green (G) light emitting element, and a blue (B) light emitting element. The light emitting element layer 14 may include a white light emitting element and a color filter. The light emitting elements EL of the light emitting element layer 14 may be covered by a protective layer including an organic film and a passivation film.

The encapsulation layer 16 covers the light emitting element layer 14 to seal the circuit layer 12 and the light emitting element layer 14. The encapsulation layer 16 may have a multilayered insulating structure in which an organic film and an inorganic film are alternately stacked. The inorganic film blocks the penetration of moisture and oxygen. The organic film planarizes the surface of the inorganic film. When the organic film and the inorganic film are stacked in multiple layers, a movement path of moisture or oxygen becomes longer compared to a single layer, so that penetration of moisture and oxygen affecting the light emitting element layer 14 can be effectively blocked.

A touch sensor layer may be disposed on the encapsulation layer 16. The touch sensor layer may include capacitive type touch sensors that sense a touch input based on a change in capacitance before and after the touch input. The touch sensor layer may include metal wiring patterns and insulating layers forming the capacitance of the touch sensors. The capacitance of the touch sensor may be formed between the metal wiring patterns. A polarizing plate may be disposed on the touch sensor layer. The polarizing plate may improve visibility and contrast ratio by converting the polarization of external light reflected by metal of the touch sensor layer and the circuit layer 12. The polarizing plate may be implemented as a polarizing plate in which a linear polarizing plate and a phase delay film are bonded, or a circular polarizing plate. A cover glass may be adhered to the polarizing plate.

The display panel 100 may further include a touch sensor layer and a color filter layer stacked on the encapsulation layer 16. The color filter layer may include red, green, and blue color filters and a black matrix pattern. The color filter layer may replace the polarizing plate and increase the color purity by absorbing a part of the wavelength of light reflected from the circuit layer and the touch sensor layer. In this embodiment, by applying the color filter layer 20 having a higher light transmittance than the polarizing plate to the display panel, the light transmittance of the display panel PNL can be improved, and the thickness and flexibility of the display panel PNL can be improved. A cover glass may be adhered on the color filter layer.

The power supply 140 generates DC power required for driving the pixel array AA and the display panel driver of the display panel 100 by using a DC-DC converter. The DC-DC converter may include a charge pump, a regulator, a buck converter, a boost converter, and the like. The power supply 140 may adjust a DC input voltage from a host system (not shown) and thereby generate DC voltages such as a gamma reference voltage VGMA, gate-on voltages VGH and VEH, gate-off voltages VGL and VEL, a pixel driving voltage EVDD, a pixel low-potential power supply voltage EVSS, a reference voltage Vref, an initial voltage Vinit, an anode voltage Vano, and the like.

The gamma reference voltage VGMA is supplied to a data driver 110. The gate-on voltages VGH and VEH and the gate-off voltages VGL and VEL are supplied to a gate driver 120. The pixel driving voltage EVDD and the pixel low-potential power supply voltage EVSS, a reference voltage Vref, an initial voltage Vinit, an anode voltage Vano, and the like are commonly supplied to the pixels.

The display panel driver writes pixel data (digital data) of an input image to the pixels of the display panel 100 under the control of a timing controller (TCON) 130.

The display panel driver includes the data driver 110 and the gate driver 120. A display panel driver may further include a data driver 110 and a demultiplexer array 112 disposed between data lines 102.

The demultiplexer array 112 sequentially supplies data voltages output from channels of the data driver 110 to the data lines 102 using a plurality of demultiplexers (DEMUXs). The demultiplexers may include a plurality of switch elements disposed on the display panel 100. When the demultiplexers are disposed between output terminals of the data driver 110 and the data lines 102, the number of channels of the data driver 110 may be reduced. The demultiplexer array 112 may be omitted.

The display panel driving circuit may further include a touch sensor driver for driving the touch sensors. The touch sensor driver is omitted from FIG. 1. The touch sensor driver may be integrated into one drive integrated circuit (IC). In a mobile device or wearable device, the timing controller 130, the power supply 140, the data driver 110, the touch sensor driver, and the like may be integrated into one drive integrated circuit (IC).

A display panel driver may operate in a low-speed driving mode under the control of a timing controller (TCON) 130. The low-speed driving mode may be set to reduce power consumption of a display device when there is no change in an input image for a preset number of frames in analysis of the input image. In the low-speed driving mode, the power consumption of the display panel driving circuit and a display panel 100 may be reduced by lowering a refresh rate of pixels when a still image is input for a predetermined time or longer. A low-speed driving mode is not limited to a case in which a still image is input. For example, when the display device operates in a standby mode or when a user command or an input image is not input to a display panel driver for a predetermined time or more, the display panel driver may operate in the low-speed driving mode.

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

The gate driver 120 may be implemented as a gate in panel (GIP) circuit formed directly on a circuit layer 12 of the display panel 100 together with the TFT array of the pixel array AA. The gate in panel (GIP) circuit may be disposed on a bezel area BZ that is a non-display area of the display panel 100 or dispersed in the pixel array on which an input image is reproduced. The gate driver 120 sequentially outputs gate signals to the gate lines 103 under the control of the timing controller 130. The gate driver 120 may sequentially supply the gate signals to the gate lines 103 by shifting the gate signals using a shift register. The gate signal may include scan pulses, emission control pulses (hereinafter referred to as "EM pulses"), initial pulses, and sensing pulses.

The shift register of the gate driver 120 outputs a pulse of the gate signal in response to a start pulse and a shift clock from the timing controller 130, and shifts the pulse according to the shift clock timing.

The timing controller 130 receives, from a host system (not shown), digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

A host system may be any one of a television (TV) system, a tablet computer, notebook computer, a navigation system, a personal computer (PC), a home theater system, a mobile device, and a vehicle system. The host system may scale an image signal from a video source according to the resolution of the display panel 100 and transmit the image signal to a timing controller 130 together with the timing signal.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (Phase-Alternating Line) scheme. The timing controller 130 may lower a driving frequency of the display panel driver by lowering a frame frequency to a frequency between 1 Hz and 30 Hz to lower a refresh rate of pixels in the low-speed driving mode.

Based on the timing signals Vsync, Hsync, and DE received from the host system, the timing controller 130 generates a data timing control signal for controlling the operation timing of the data driver 110, a control signal for controlling the operation timing of the de-multiplexer array 112, and a gate timing control signal for controlling the operation timing of the gate driver 120. The timing controller 130 controls an operation timing of the display panel driver to synchronize the data driver 110, the demultiplexer array 112, a touch sensor driver, and a gate driver 120.

The voltage level of the gate timing control signal outputted from the timing controller 130 may be converted into the gate-on voltages VGH and VEH and the gate-off voltages VGL and VEL through a level shifter (not shown) and then supplied to the gate driver 120. That is, the level shifter converts a low level voltage of the gate timing control signal into the gate-off voltages VGL and VEL and converts a high level voltage of the gate timing control signal into the gate-on voltages VGH and VEH. The gate timing signal includes the start pulse and the shift clock.

Due to process variations and device characteristic variations caused in a manufacturing process of the display panel 100, there may be a difference in electrical characteristics of the driving elements of each pixels, and this difference may increase over time. Further, based on the driving time of the each respective pixel, the difference in electrical characteristics may increase. An internal compensation technology or an external compensation technology may be applied to an organic light-emitting diode display to compensate for the variations in electrical characteristics of a driving element between the pixels. The internal compensation technology samples a threshold voltage of the driving element for each sub-pixel using an internal compensation circuit implemented in each pixel circuit to compensate for a gate-source voltage Vgs of the driving element as much as the threshold voltage. The external compensation technology senses in real time a current or voltage of the driving element which changes according to the electrical characteristics of the driving element using an external compensation circuit. The external compensation technology compensates for the variation and changes over time in the electrical characteristics of the driving element in each pixel in real time by modulating the pixel data, which is the driving data of the input image as based on the electric characteristic variation and changes over time of the driving element sensed for each pixel. The display panel driver may drive the pixels using the external compensation technology and/or the internal compensation technology.

Figure 3:
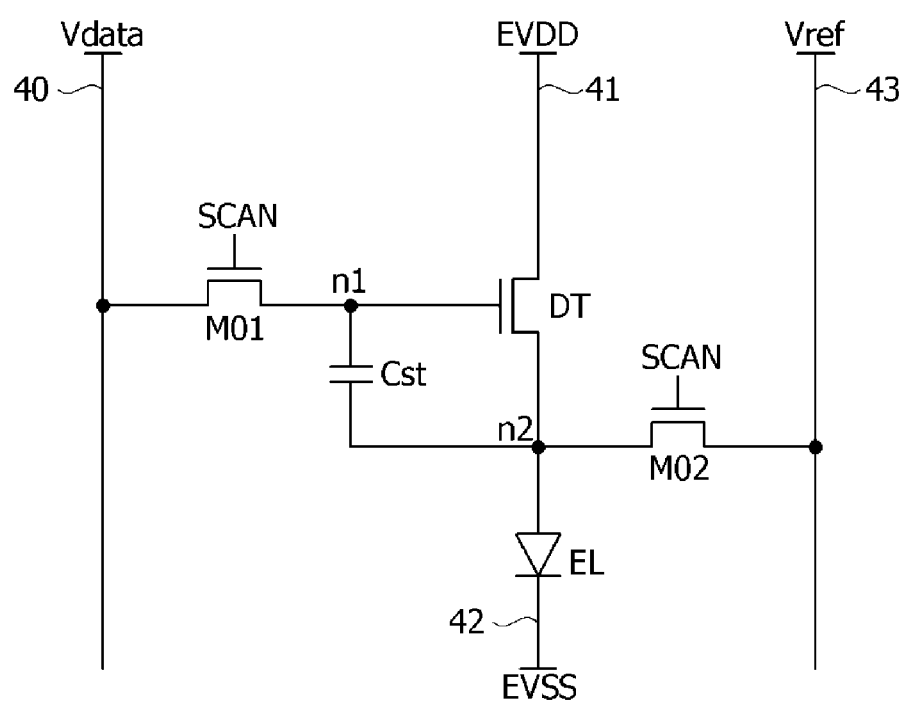
FIG. 3 is a circuit diagram illustrating a pixel circuit connected to an external compensation circuit of the present disclosure.

FIG. 3 is a circuit diagram illustrating the pixel circuit that is connected to the external compensation circuit of the present disclosure.

Referring to FIG. 3, the pixel circuit includes a light-emitting element EL, a driving element DT which supplies a current to the light-emitting element EL, a first switch element M01 which connects a data line 40 in response to a scan pulse SCAN, a capacitor Cst connected to a gate electrode of the driving element DT, and a second switch element M02 which connects a reference voltage line 43 in response to the scan pulse SCAN A pixel driving voltage EVDD is applied to a first electrode of the driving element DT through a first power line 41. The driving element DT drives the light emitting element OLED by supplying a current to the light emitting element OLED according to a gate-source voltage Vgs. The light emitting element OLED is turned on and emits light when a forward voltage between an anode and a cathode is greater than or equal to a threshold voltage. A low potential voltage ELVSS is applied to a cathode of the light-emitting element EL. The capacitor Cst is connected between the gate electrode and a second electrode of the driving element DT to maintain a gate-source voltage Vgs of the driving element DT.

The first switch element M01 is turned on according to a gate-on voltage of the scan pulse SCAN applied from a gate line and connects the signal from the data line 40 to the gate electrode of the driving element DT and the capacitor Cst.

The second switch element M02 applies a reference voltage Vref in response to the scan pulse SCAN. The reference voltage Vref is applied to the pixel circuit through the reference voltage line 43. When the circuit operates in the drive mode to emit light, transistor M02 is a compensation switching transistor.

The light-emitting element EL may be implemented as an OLED. The OLED includes an organic compound layer formed between an anode and a cathode. The organic compound layer may include a hole injection layer (HIL), a hole transport layer (HTL), a light-emitting layer (EML), an electron transport layer (ETL), an electron injection layer (EIL), and the like, but is not limited thereto. The switch elements M01 and M02 may be implemented as n-channel oxide thin film transistors (TFTs).

An organic light emitting diode used as the light emitting element may have a tandem structure in which a plurality of light emitting layers are stacked. The organic light emitting diode having the tandem structure may improve the luminance and lifespan of the pixel.

FIGS. 4 to 8 are views for describing an operation principle of a sensing circuit according to the embodiment.

Figure 4:
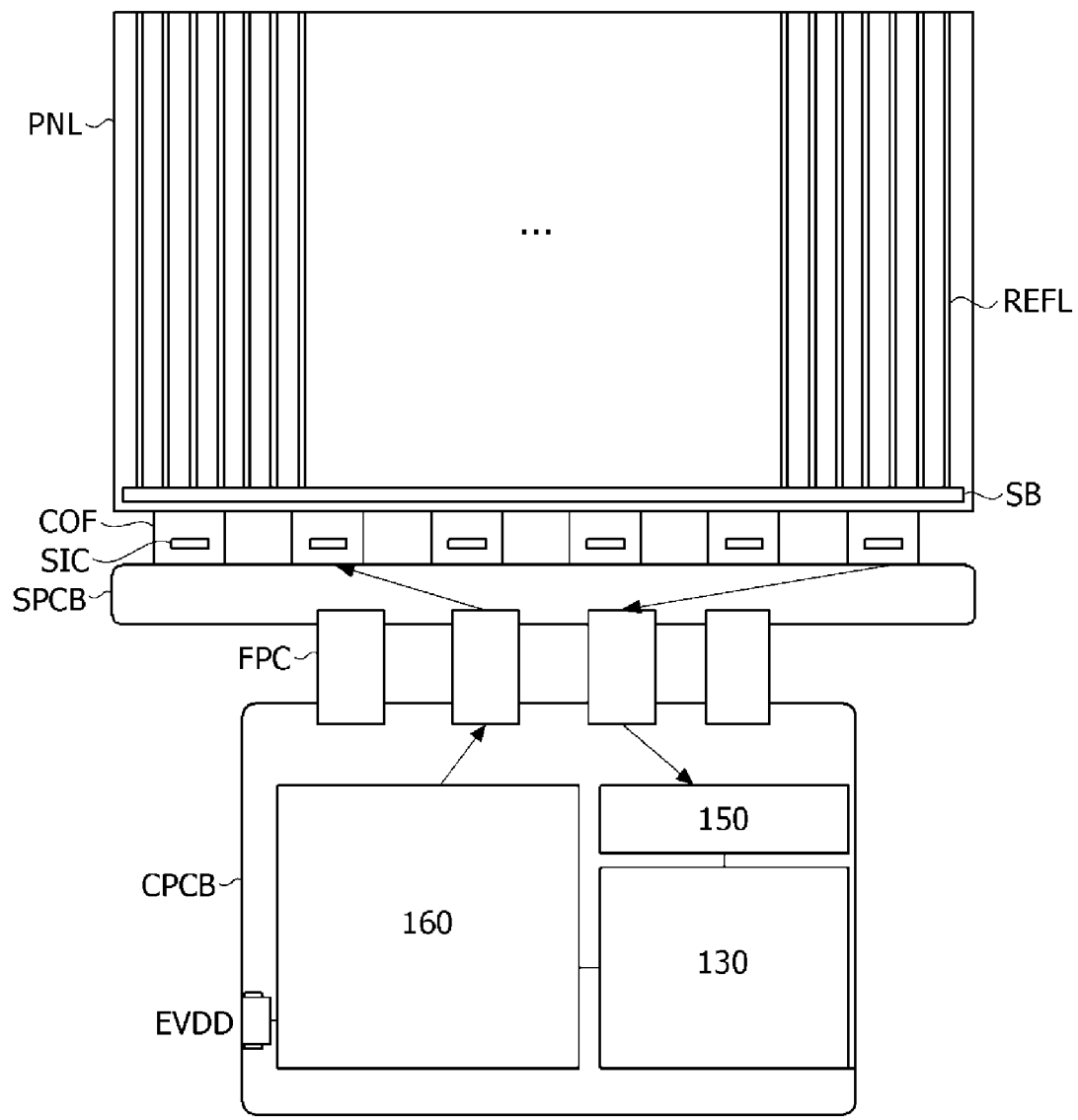
FIG. 4 is a chip on film (COF) coupled to a display panel according to the embodiment of the present disclosure.

Referring to FIG. 4, a chip on film (COF) may be adhered to a display panel PNL. The COF includes a drive IC SIC and connects a source PCB (SPCB) to the display panel PNL. The drive IC SIC includes a data driver.

The timing controller 130 and a power unit 150 may be mounted on a control PCB CPCB. The control PCB CPCB may be connected to the source PCB SPCB through a flexible circuit film, for example, a flexible printed circuit (FPC).

The timing controller 130 may adjust the reference voltage Vref output from the power unit 150 on the basis of a result of comparing the reference voltage Vref sensed from the display panel PNL and the reference voltage Vref output from the power unit 150 by including the above-described reference voltage controller.

The reference voltage Vref output from the power unit 150 may be supplied to the display panel PNL via the FPC, the source PCB SPCB, and the COF. Accordingly, in the display panel PNL, a lead-in part IN of the reference voltage Vref is close to the drive IC SIC.

Reference voltage lines REFL on the display panel PNL may be connected to the power unit 150 via the COF, the SPCB, and the FPC. The reference voltage lines REFL may be grouped by a shorting bar SB. The shorting bar may be formed on one side of the display panel PNL, and may be formed as a line of glass (LOG) line on the display panel rather than in the drive IC SIC. The reference voltage lines REFL connected to all pixels on the display panel PNL may be connected to the shorting bar.

A sensing circuit 160 senses a current flowing through a pixel power line to which a high potential voltage EVDD is applied when driving in a sensing mode after the power is turned off. The sensing circuit 160 provides the sensed current to the timing controller 130.

Figure 5:
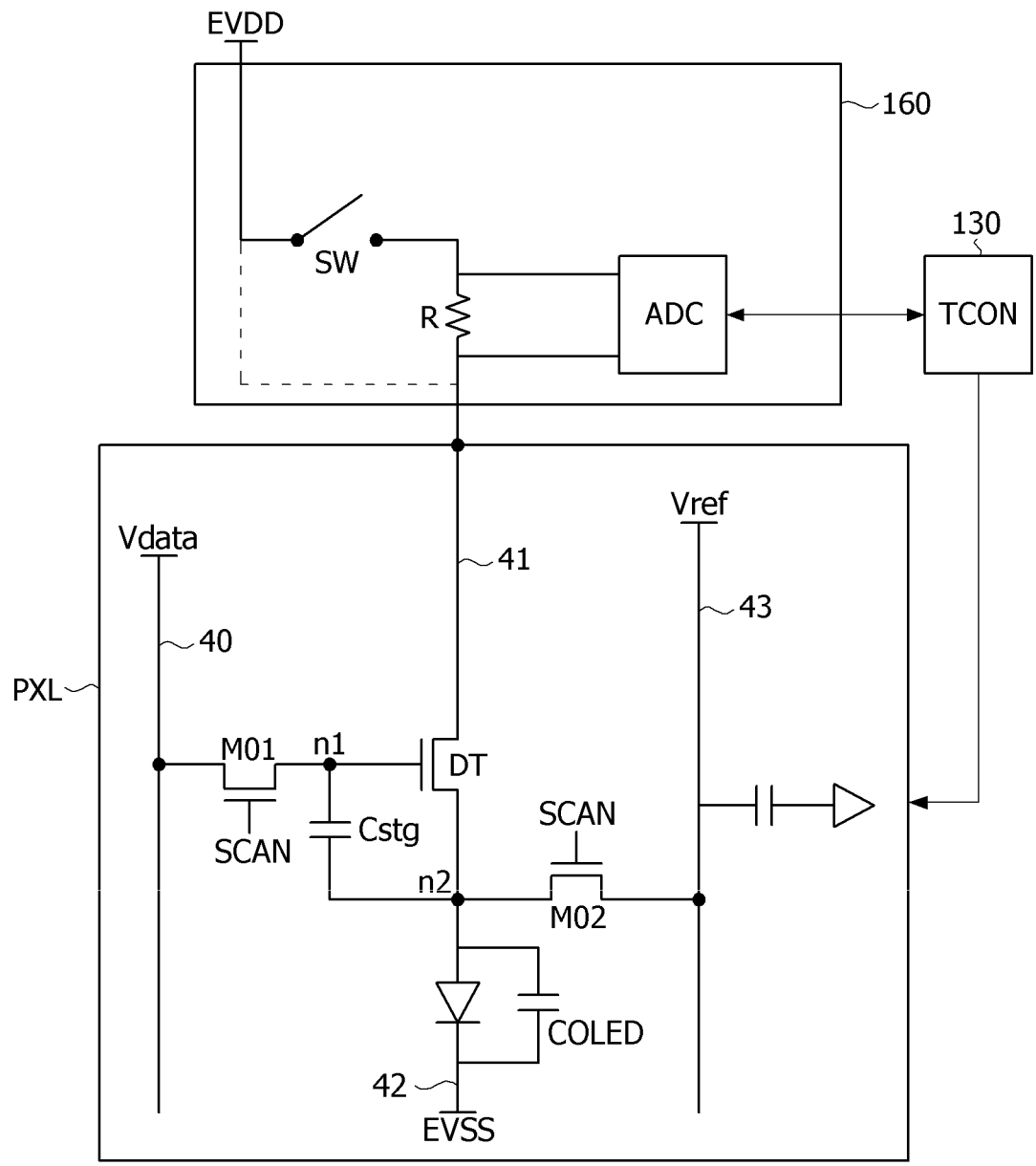
FIG. 5 is a sensing unit coupled to a pixel according to the embodiment of the present disclosure.

Referring to FIG. 5, the sensing circuit 160 may include a resistor R connected to the pixel power line and an analog-to-digital converter (ADC) connected to the resistor. The sensing circuit 160 may further include a switch SW connected between the pixel power line and the resistor. The switch SW is turned off, namely is open, in a display mode and turned on to be closed in the sensing mode.

When a switch SW is turned off in the display mode, the high potential voltage EVDD is directly applied to a pixel PXL through the pixel power line, shown as the dashed line in FIG. 5. When the switch SW is turned on in the sensing mode, the high potential voltage is applied to the pixel through the resistor R, and the current flowing through the resistor is sensed and during this time the current running through the dashed line is blocked so that node 41 is disconnected from the line EVDD when the switch SW is turn on. When the switch SW is closed, the ADC converts sensed current to a digital signal and transfers the digital signal to the timing controller (TCON) 130. The timing controller 130 then creates a compensation voltage based on the sensed current, which compensation voltage is applied to the reference voltage Vref when the diode is driven to emit light.

Figure 6:
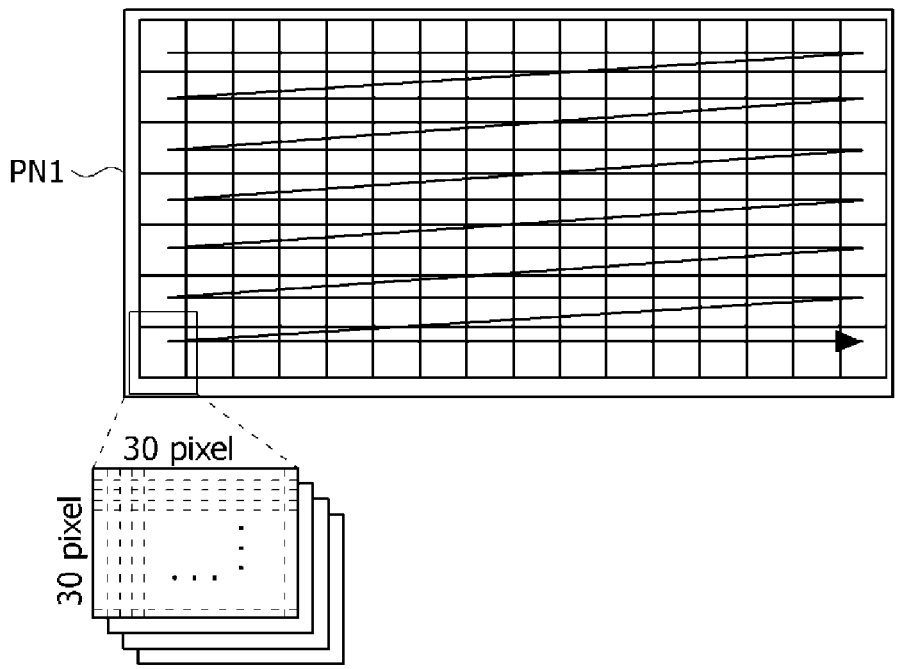
FIG. 6 is a shows a pixel to be coupled to the blocks to be sensed by the sensing unit as described with respect to the various figures, including FIG. 5 according to the embodiment of the present disclosure.

Referring to FIG. 6, the sensing unit senses the current in units of blocks of pixels including a predetermined number of pixels. Here, the block may have a square shape in which the number of pixels in a line direction X and the number of pixels in a column direction Y are the same, for example, a square shape of 30 pixels×30 pixels. The block is not limited to the square shape and may be implemented in various shapes.

The sensing unit senses the current in units of blocks of pixels, and senses the current flowing through each block in a predetermined order. Different currents are sensed according to characteristics and deterioration levels of pixels included in each block.

A method of sensing the current in units of blocks may decrease an overall sensing time compared to a method of sensing the current in units of pixels, and may be realized in a simple structure.

FIG. 7A1 shows a circuit according to one embodiment and 7A2 shows the voltage present at various nodes in 7A1 as Data and SCAN transition between high and low over a selected time period. Referring to FIGS. 7A1 and 7A2 together, in the embodiment, the gate-on voltage of the scan pulse SCAN is applied to the first switch element M01 and the second switch element M02 when driving in the sensing mode. When the circuit operates in the sensing mode, transistor M02 acts as a bypass switching transistor. The first and second switch elements are turned on after the gate-on voltage at the value SCAN being sufficiently high is applied to form a very low resistance current path through which the current flowing through a pixel driving voltage line 41 flows to the reference voltage line 43 instead of flowing to the light-emitting element line 42. As can be seen viewing 7A2, the voltage on node n1 shown by Vg goes high, turning on transistor DT and driving the data to node n2. The transistor M02 is also brought high to connect the value on line 43 to node n2. The value of the SCAN voltage applied to M02 during the sensing time period is select to cause the effective resistance of that transistor to approach zero, therefor the voltage at node n2 remains below the threshold voltage of the light emitting diode EL, keeping the diode EL in the off state. When a high level voltage is continuously applied to the gate of the switch element M02, the voltage of the source node n2 maintains lower than the voltage for turning on the EL. This causes the current to flow to the reference voltage line 43 and not to the EL. Accordingly, current sensing may be performed without emitting light from the light-emitting element.

It is noted that some known circuit components and their operation are shown in the figures to provide a more complete, operational circuit and context for the inventive features even though they are well known to those of skill in the art, but to focus on the inventive features of the written specification, the details and operation of such well known features are not described herein.

FIG. 7B1 shows a circuit according to one embodiment and 7B2 shows the voltage present at various nodes in 7B1 as the SCAN transitions between high and low over a selected time period, but the data remains low. Referring to FIGS. 7B1 and 7B2 together, in the comparative example, a gate-off voltage of the scan pulse SCAN is applied to the first switch element M01 and the second switch element M02 in the sensing mode. Since the first and second switch elements M01 and M02 are turned off when the gate-off voltage is applied, and thus the current flowing through the pixel driving voltage line 41 is applied to the node n2 coupled to line 42 for driving the light-emitting element, the light-emitting element emits light, even though no data was provided. After the SCAN signal goes low, the voltage Vg, node n1 rises and fully turns on the drive transistor DT and thus couples the voltage EVDD to node n2, shown as Vs in 7B2, reaching the threshold voltage of the diode EL and causing it to emit light. When the light-emitting element emits light after power-off, a user will see the light, even though no data was provided and the pixel should have remained dark to provide the desired image on the display. In the FIG. 7B2, Vg is the voltage on node n1 and Vs is the voltage on node n2 as shown in FIG. 7B1.

Figure 11:
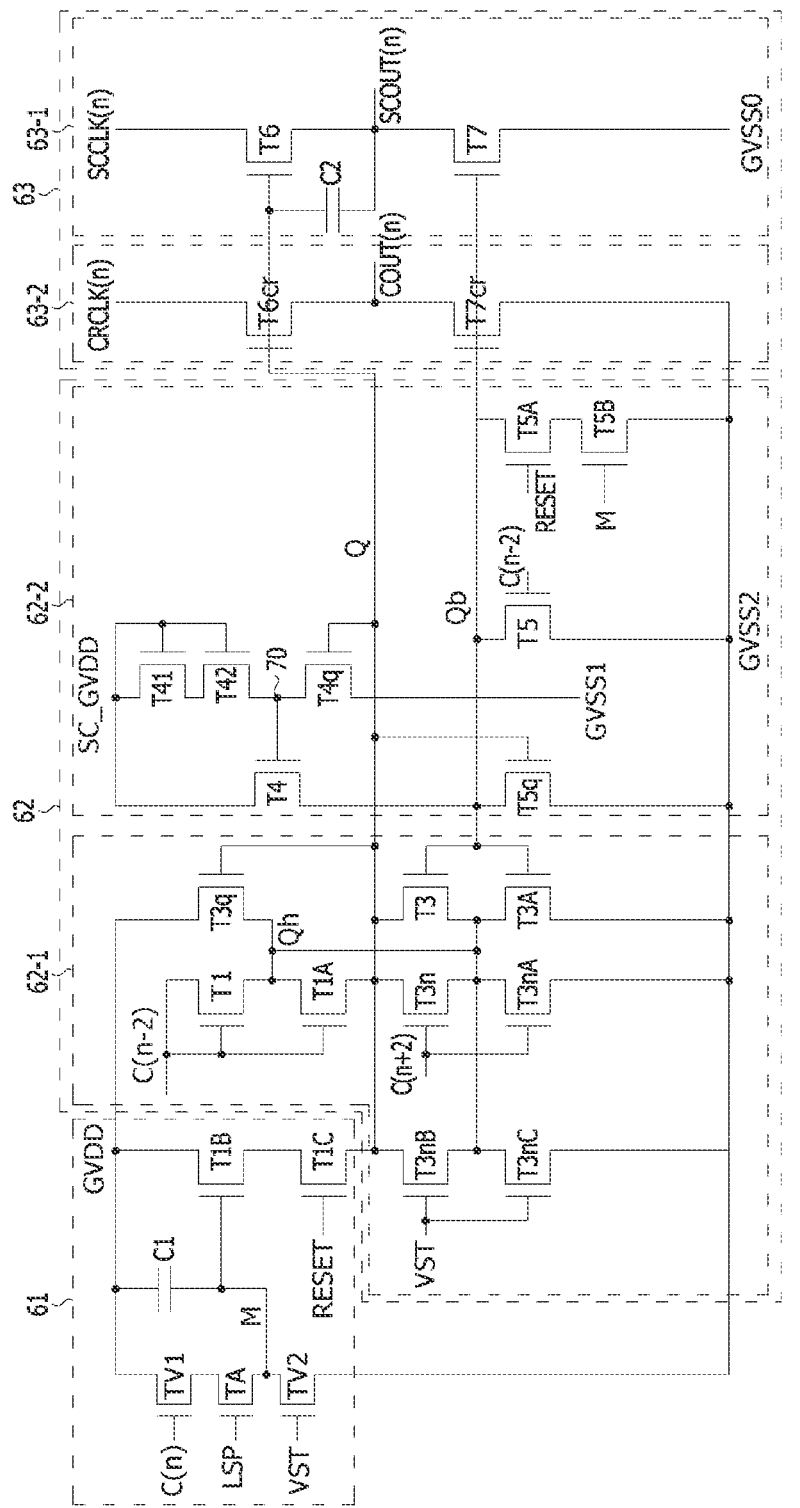
FIG. 11 is a view illustrating a gate driver according to a first embodiment of the present disclosure.
Figure 17:
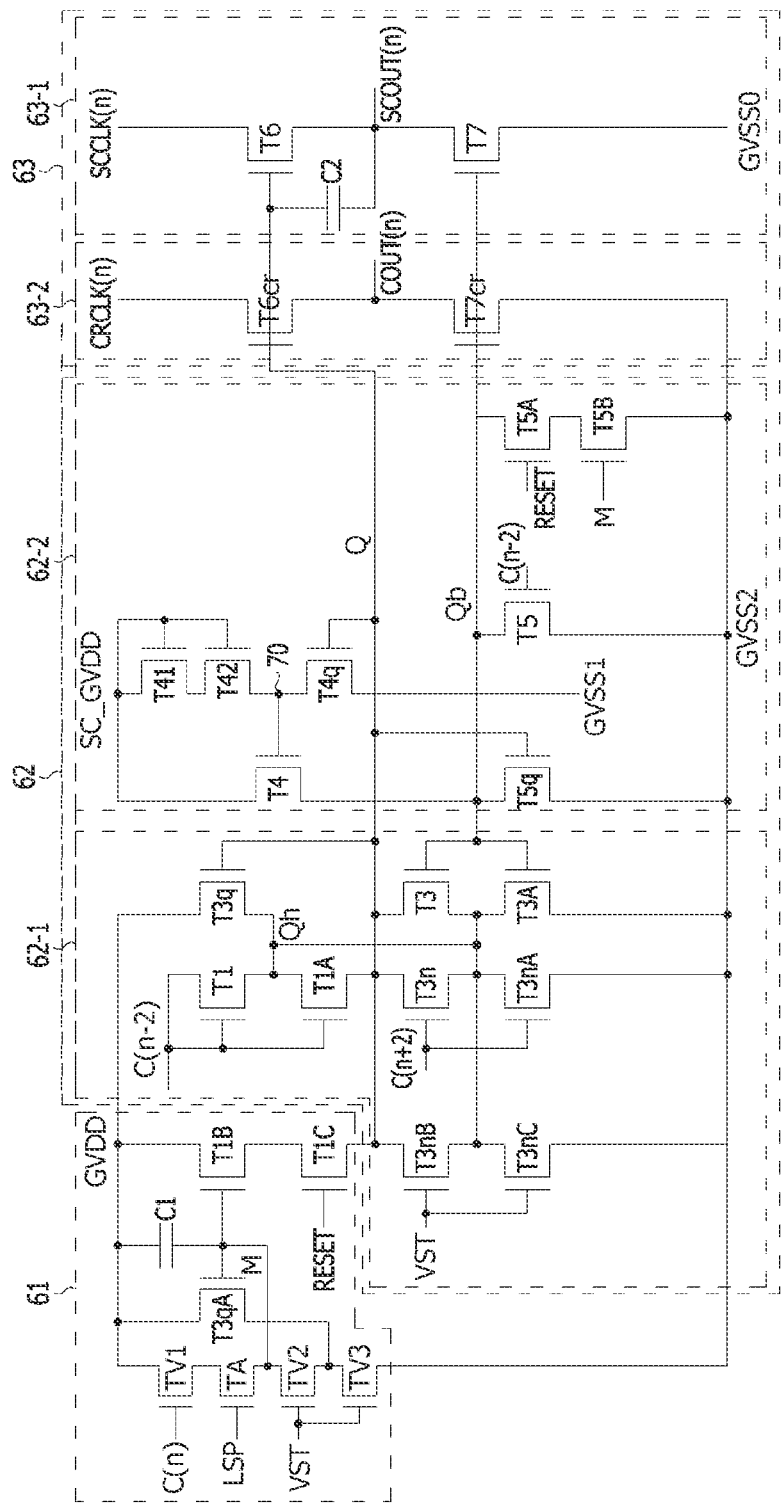
FIG. 17 is a view illustrating a gate driver according to a second embodiment of the present disclosure.

Accordingly, in the embodiment of present discourse, it is possible to measure the current flowing through the pixel power line without causing the light emitting element to emit light by driving both the first and second switch elements and changing the current path when driving in the sensing mode. Thus, in some embodiments, the SCAN signal of FIGS. 3 and 5 is provided by the gate driver as shown in FIGS. 11 and 17.

Figure 8:
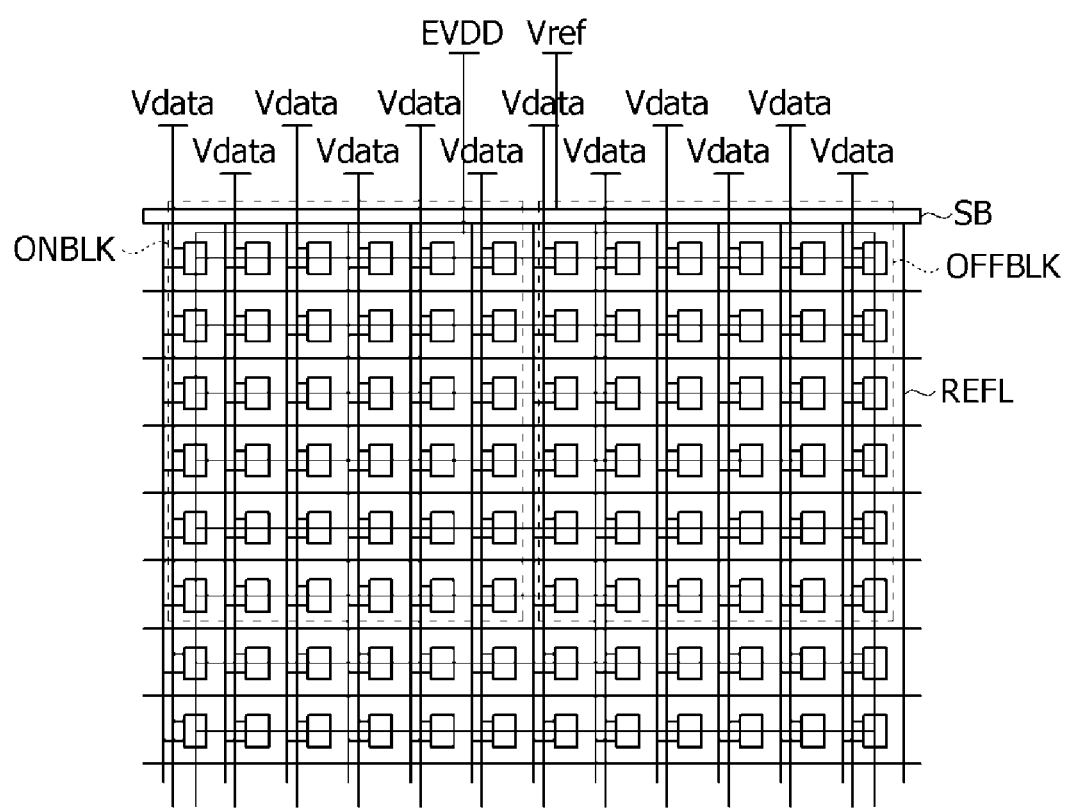
FIG. 8 is a pixel structure for sensing the current in units of blocks according to the embodiment of the present disclosure.

Referring to FIG. 8, the embodiment shows a pixel structure for sensing the current in units of blocks. The reference voltage line and a high potential voltage line are connected to all pixels on the display panel to be shared, and a data voltage line is connected to each of the pixels in the column direction Y.

Accordingly, even when the reference voltage and the high potential voltage are applied to all pixels on the display panel, it is possible to select a block in which sensing is performed according to whether data is applied. For example, white data is applied to all pixels in a first block ONBLK in which sensing is performed, and black data is applied to all pixels in a second block OFFBLK in which the sensing is not performed.

Here, while the white data is applied to one block on the display panel, the black data is applied to the remaining blocks.

When the white data is applied to all pixels in the first block to be sensed, the sensing unit senses the current flowing through the pixel driving voltage line. In this case, since the current flowing through the pixel driving voltage line has a large value in units of blocks, an integrator is not required in the sensing unit.

Figure 9:
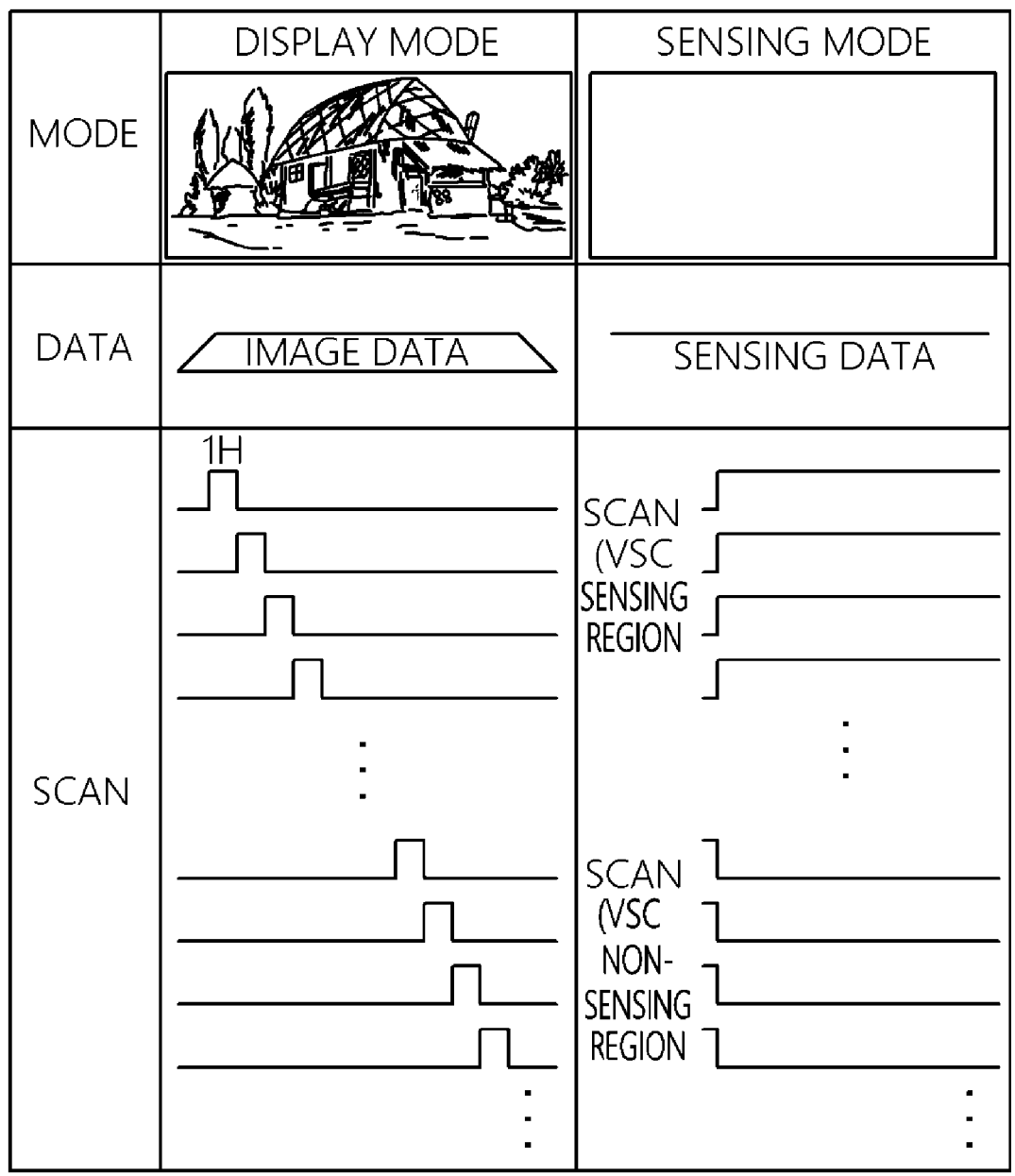
FIG. 9 is a view for describing a driving method according to a mode according to the embodiment of the present disclosure.

FIG. 9 is a view for describing a driving method according to a mode according to the embodiment of the present disclosure.

Referring to FIG. 9, when driving in the display mode, the gate driver may sequentially output scan signals, and the data driver may output image data to display an image.

When driving in the sensing mode after power-off, the gate driver outputs a scan pulse of a high voltage level to a sensing region, and outputs a scan pulse of a low-level voltage to a non-sensing region, and the data driver outputs the white data or sensing data to a block to be sensed, that is, the sensing region, while outputting the black data to a block not to be sensed, that is, the non-sensing region, to sense the current without causing the block to be sensed to emit light.

Figure 10:
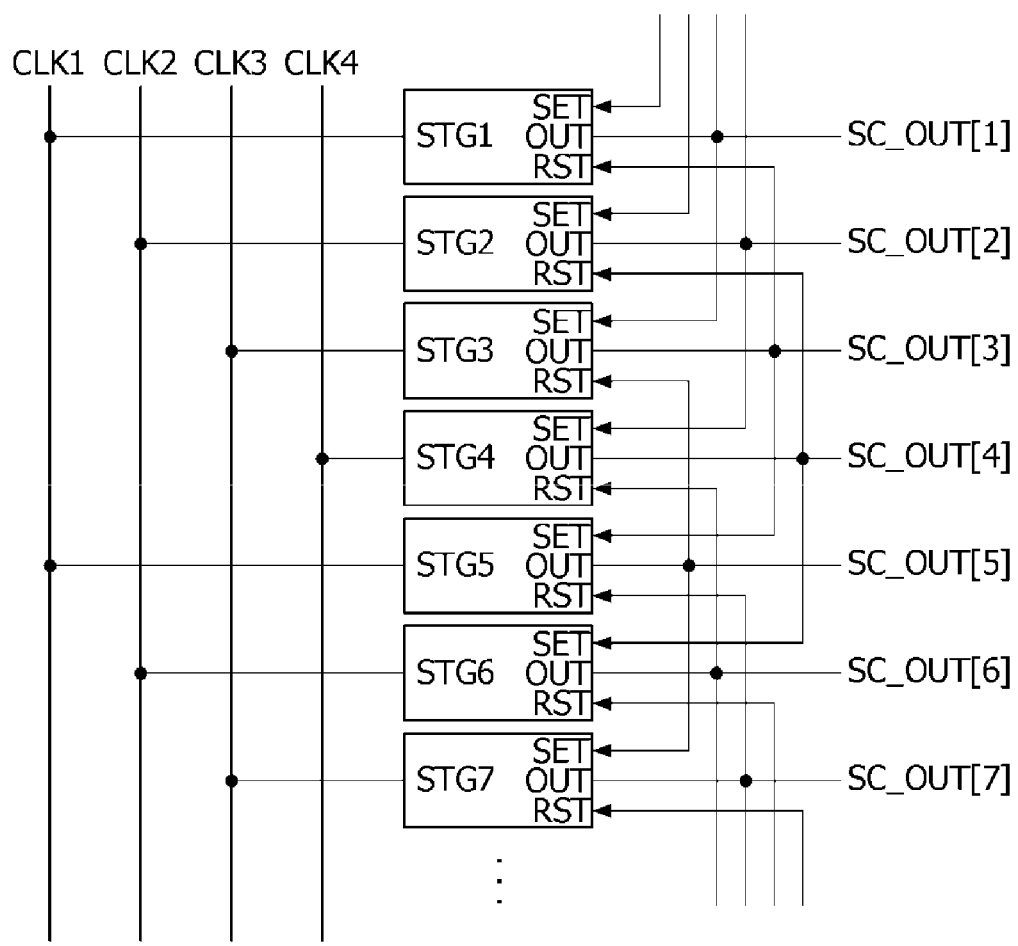
FIG. 10 is a view illustrating a shift register of a gate driver according to the embodiment of the present disclosure.

FIG. 10 is a view illustrating a shift register of the gate driver according to the embodiment of the present disclosure.

Referring to FIG. 10, the gate driver 120 according to the embodiment includes a plurality of signal processing units ST1, ST2, ST3, ST4, and ST5 which are cascade-connected via a carry line through which a carry signal is transmitted.

The timing controller 130 may adjust a width and multi-output of an output signal SC_OUT of the gate driver using a start pulse Vst input to the gate driver 120.

Each of the signal processing units ST1, ST2, ST3, ST4, and ST5 receives a start pulse or a carry signal output from a previous odd-numbered or even-numbered signal processing unit and clock signals CLK1, CLK2, CLK3, and CLK4. A first signal processing unit ST1 starts to be driven according to the start pulse Vst, and the other signal processing units ST2, ST3, ST4, and ST5 receive the carry signal from the previous odd-numbered or even-numbered signal processing unit and start to be driven.

Each of the signal processing units ST1, ST2, ST3, ST4, and ST5 sequentially outputs the scan signals by shifting the start pulse or the carry signal output from the previous odd-numbered or even-numbered signal processing unit according to a timing of the clock signal.

Figure 12A:
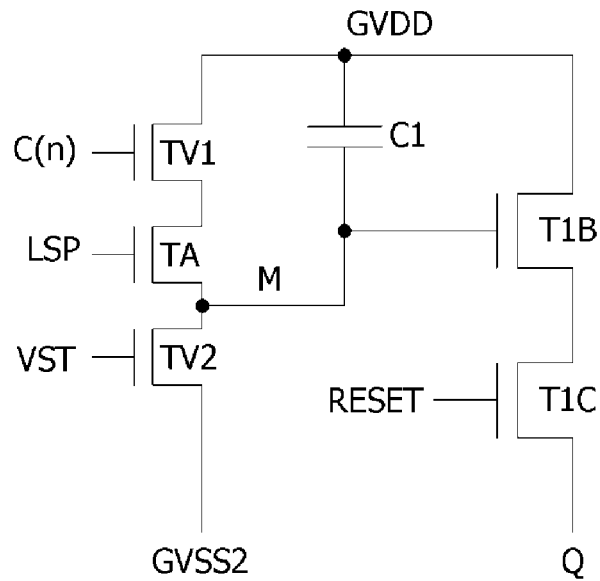
FIGS. 12A and 12B are views for comparatively describing a configuration of a line selection unit shown in FIG. 11.
Figure 12B:
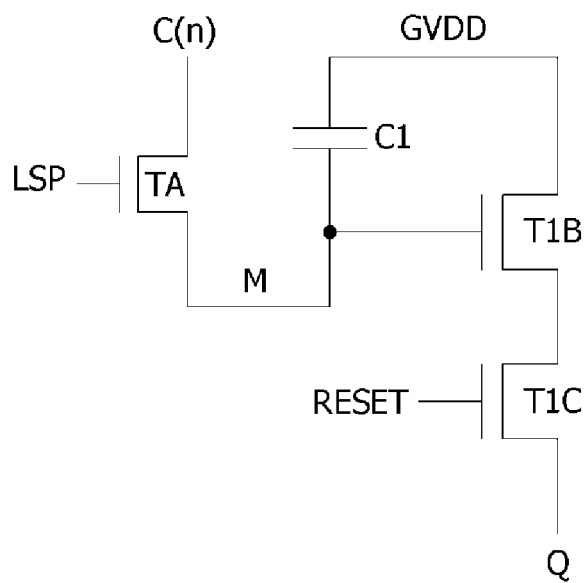
Figure 13:
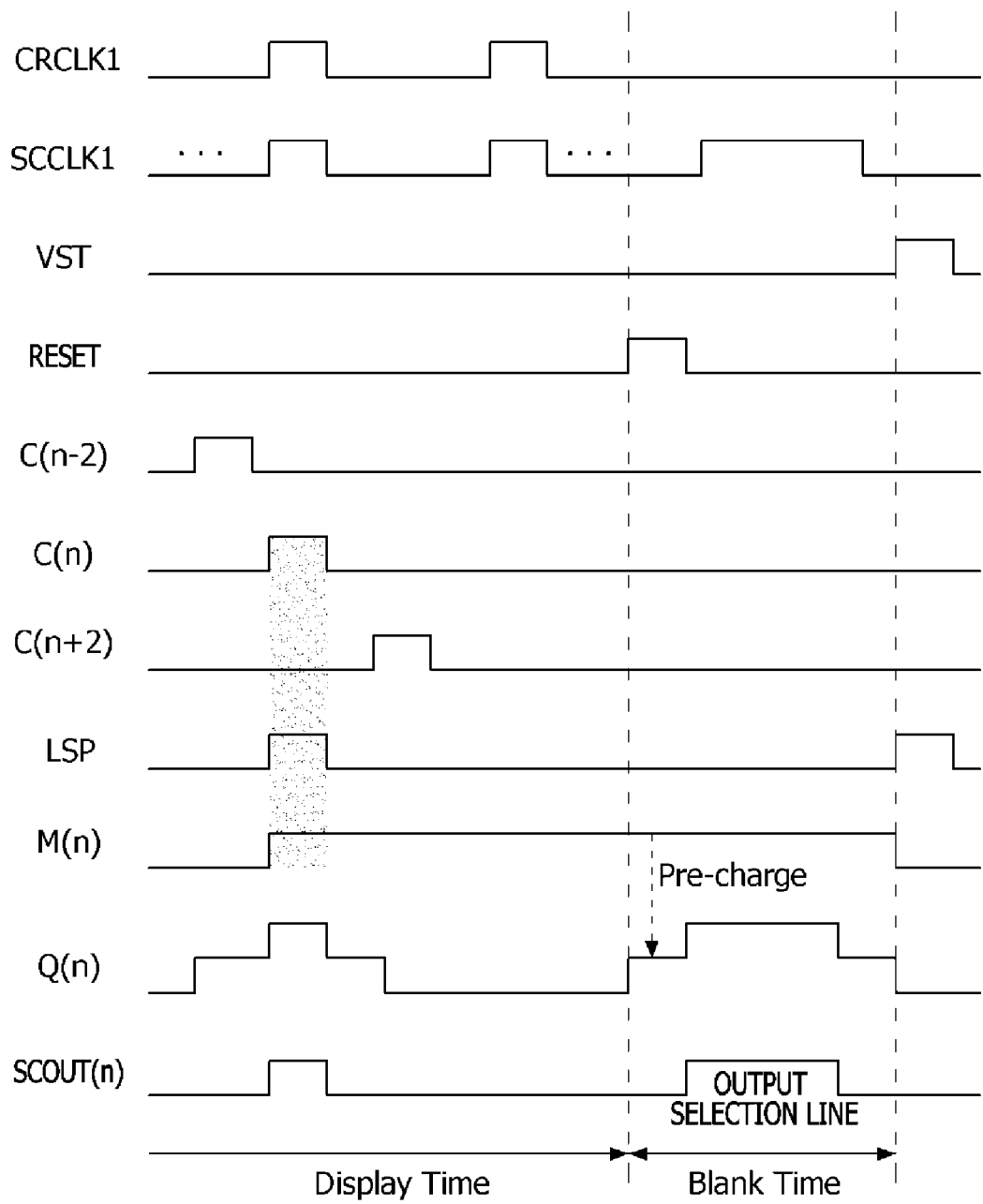
FIG. 13 is a waveform diagram illustrating input/output signals and voltages of control nodes of the gate driver shown in FIG. 11.

FIG. 11 is a view illustrating a gate driver according to a first embodiment of the present disclosure, FIGS. 12A and 12B are views for comparatively describing a configuration of a line selection unit shown in FIG. 11, and FIG. 13 is a waveform diagram illustrating input/output signals and voltages of control nodes of the gate driver shown in FIG. 11.

Referring to FIG. 11 and FIGS. 12A and 12B, the gate driver according to the first embodiment of the present disclosure may include a first control node which pulls up an output voltage (hereinafter referred to as a "Q node"), a second control node which pulls down an output voltage (hereinafter referred to as a "Qb node"), a line selection unit 61, a circuit unit 62, and an output unit 63.

The line selection unit 61 charges an M node to a first high potential voltage GVDD according to the display mode, and according to the sensing mode after the display mode, a Q node Q may be charged to a high potential voltage based on a charging voltage of the M node and a sensing start signal RESET.

The line selection unit 61 may include a first transistor TV1, a second transistor TA, a third transistor TV2, a fourth transistor T1B, a fifth transistor T1C, and a first capacitor C1.

The first transistor TV1 is turned on by a carry signal C(n) and charges the M node to the high potential voltage of the first high potential voltage line GVDD together with the second transistor TA. The first transistor TV1 includes a first electrode connected to the first high potential voltage line GVDD, a gate electrode to which the carry signal C(n) (corresponding to the carry signal described in FIG. 10) is applied, and a second electrode connected to a first electrode of the second transistor TA.

The second transistor TA is turned on by a line selection signal (line select pulse, LSP) and charges the M node to the high potential voltage of the first high potential voltage line GVDD together with the first transistor TV1. The second transistor TA includes the first electrode connected to the second electrode of the first transistor TV1, a gate electrode to which the line selection signal is applied, and a second electrode connected to the M node.

The third transistor TV2 is turned on by a start signal VST (corresponding to the start pulse Vst input generated by timing controller 130 described in FIG. 10) and discharges the M node to a low potential voltage of a second low potential voltage line GVSS2. The third transistor TV2 includes a first electrode connected to the M node, a gate electrode to which the start signal is applied, and a second electrode connected to the low potential voltage line GVSS2.

The fourth transistor T1B is turned on by the M node and charges the Q node Q to the high potential voltage of the first high potential voltage line GVDD together with the fifth transistor T1C. The fourth transistor T1B includes a first electrode connected to the first high potential voltage line GVDD, a gate electrode connected to the M node, and a second electrode connected to a first electrode of the fifth transistor T1C.

The fifth transistor T1C is turned on by the sensing start signal RESET and charges the Q node Q to the high potential voltage of the first high potential voltage line GVDD together with the fourth transistor T1B. The fifth transistor T1C includes the first electrode connected to the second electrode of the fourth transistor T1B, a gate electrode to which the sensing start signal RESET is applied, and a second electrode connected to the Q node Q.

The first capacitor C1 is connected between the first high potential voltage line GVDD and the M node, and stores the high potential voltage applied to the M node.

In the embodiment, the M node is charged to the high potential voltage, and the M node is charged to the high potential voltage so that a plurality of lines may be selected when driving in the sensing mode.

That is, referring to FIGS. 12A and 12B, in the embodiment of FIG. 12A, when the carry signal and the line selection signal are simultaneously applied, since the M node is charged to the first high potential voltage GVDD, the charging voltage of the M node is maintained regardless of the high voltage level or the low voltage level of the carry signal in the case in which the carry signal and the line selection signal are applied when the next line is selected.

However, in the comparative example in FIG. 12B, when the line selection signal is applied, since the M node is charged to the high voltage level of the carry signal, the charging voltage of the M node is not maintained and is discharged due to the low voltage level of the carry signal in the case in which the line selection signal is applied when the next line is selected.

Charging the M node prior to a sensing mode (before applying a sensing start signal RESET) is an advantage of the gate driver circuit in FIG. 11 that allows driving more than one pixel during the sensing mode. In this fashion, the node M is charged to a first voltage level about GVDD during the display mode. By starting the sensing mode (by applying the RESET signal to the gate drive circuit) the Q node Q is coupled to the M node. Thus, the Q node Q has a pre-charged voltage level of the M node prior driving the output stage. This pre-charged value allows the Q node Q to provide a sufficient power for a plurality of pixels. As a result, the present embodiment enable the benefit of the concurrent sensing of a plurality of lines of a display device while bypassing the light emitting elements of the plurality of pixels during the sensing.

The circuit unit 62 may include a first circuit unit 62-1 and a second circuit unit 62-2.

The first circuit unit 62-1 serves to control charging and discharging of the Q node Q and the Qb node Qb. The first circuit unit 62-1 includes an eighth transistor T1, a ninth transistor T1A, a tenth transistor T3, an eleventh transistor T3A, a twelfth transistor T3$n$, a thirteenth transistor T3$n$A, a fourteenth transistor T3$q$, a fifteenth transistor T3$n$B, and a sixteenth transistor T3$n$C.

The eighth transistor T1 is turned on by an N−2th carry signal applied through an N−2th carry signal line C(n−2), and transmits the N−2th carry signal to a Qh node Qh. In the eighth transistor T1, a gate electrode and a first electrode are commonly connected to the N−2th carry signal line C(n−2), and a second electrode is connected to the Qh node Qh.

The ninth transistor T1A is turned on by the N−2th carry signal applied through the N−2th carry signal line C(n−2), and charges the Q node Q based on the N−2th carry signal. In the ninth transistor T1A, a gate electrode is connected to the N−2th carry signal line C(n−2), a first electrode is connected to the second electrode of the first transistor T1, and a second electrode is connected to the Q node Q.

The tenth transistor T3 is turned on by the Qb node Qb and discharges the Q node Q to a second low potential voltage of the second low potential voltage line GVSS2 together with the eleventh transistor T3A. In the tenth transistor T3, a gate electrode is connected to the Qb node Qb, a first electrode is connected to the Q node Q, and a second electrode is connected to a first electrode of the eleventh transistor T3A.

The eleventh transistor T3A is turned on by the Qb node QB and discharges the Q node Q to the second low potential voltage of the second low potential voltage line GVSS2 together with the tenth transistor T3. In the eleventh transistor T3A, a gate electrode is connected to the Qb node Qb, the first electrode is connected to the second electrode of the tenth transistor T3, and a second electrode is connected to the second low potential voltage line GVSS2.

The twelfth transistor T3$n$ is turned on by an N+2th carry signal applied through an N+2th carry signal line C(n+2), and discharges the Q node Q to the second low potential voltage of the second low potential voltage line GVSS2 together with the thirteenth transistor T3nA. In the twelfth transistor T3n, a gate electrode is connected to the N+2th carry signal line C(n+2), a first electrode is connected to the Q node Q, and a second electrode is connected to a first electrode of the thirteenth transistor T3nA.

The thirteenth transistor T3nA is turned on by the N+2th carry signal applied through the N+2th carry signal line C(n+2), and discharges the Q node Q to the second low potential voltage of the second low potential voltage line GVSS2 together with the twelfth transistor T3n. In the thirteenth transistor T3nA, a gate electrode is connected to the N+2th carry signal line C(n+2), the first electrode is connected to the second electrode of the twelfth transistor T3n, and a second electrode is connected to the second low potential voltage line GVSS2.

The fourteenth transistor T3q is turned on by the Q node Q and transmits the high potential voltage of the first high potential voltage line GVDD to the Qh node Qh. In the fourteenth transistor T3q, a gate electrode is connected to the Q node Q, a first electrode is connected to the first high potential voltage line GVDD, and a second electrode is connected to the Qh node Qh.

The fifteenth transistor T3nB is turned on by the start pulse VST, and discharges the Q node Q to the second low potential voltage of the second low potential voltage line GVSS2 together with the sixteenth transistor T3nC. The fifteenth transistor T3nB includes a first electrode connected to the Q node Q, a gate electrode to which the start pulse VST is applied, and a second electrode connected to a first electrode of the sixteenth transistor T3nC.

The sixteenth transistor T3nC is turned on by the start pulse VST and discharges the Q node Q to the second low potential voltage of the second low potential voltage line GVSS2 together with the fifteenth transistor T3nB. The sixteenth transistor T3nC includes the first electrode connected to the second electrode of the fifteenth transistor T3nB, a gate electrode to which the start pulse VST is applied, and a second electrode connected to the second low potential voltage line GVSS2.

The second circuit unit 62-2 includes a seventeenth transistor T4, an eighteenth transistor T41, a nineteenth transistor T4q, a twentieth transistor T5q, and a twenty-first transistor T5.

The seventeenth transistor T4 is turned on when there is a high voltage on a first node 70, and supplies a high potential voltage to the Qb node Qb. The seventeenth transistor T4 includes a first electrode connected to a high potential voltage line to which the high potential voltage is applied, a gate electrode connected to the first node 70, and a second electrode connected to the Qb node Qb.

The eighteenth transistor T41 is turned on by a second high potential voltage SC_GVDD that is applied to both its drain and its gate electrode. It thus is a diode connected transistor. The source of T41 is coupled to the drain of T42 that has its gate electrode connected to SC_GVDD, so it is also a diode connected transistor. The source of T42 supplies a high potential voltage to the first node 70 which is equal to the SC_GVDD minus the voltage drop across the transistors T41 and T42. The potential SC_GVDD is the second high potential that is specifically provided to be available to node 70 and to be pulled towards ground when node 70 is pulled towards GVSS1 by T4q going high. Thus, SC_GVDD is a separate high potential that is different from GVDD and is electrically isolated from it.

The nineteenth transistor T4q is turned on by the voltage of the Q node, and discharges the first node 70 to the third low potential voltage of the third low potential voltage line GVSS1. The nineteenth transistor T4q includes a first electrode connected to the first node 70, a gate electrode connected to the Q node Q, and a second electrode connected to the third low potential voltage line GVSS1.

The twentieth transistor T5q is turned on by the voltage of the Q node, and discharges the Qb node Qb to the second low potential voltage of the second low potential voltage line GVSS2. The twentieth transistor T5q includes a first electrode connected to the Qb node Qb, a gate electrode connected to the Q node Q, and a second electrode connected to the second low potential voltage line GVSS2.

The twenty-first transistor T5 is turned on by the voltage of the carry signal line C(n−2) from the previous signal transmission unit, and discharges the Qb node Qb to the second low potential voltage of the second low potential voltage line GVSS2. The twenty-first transistor T5 includes a first electrode connected to the Qb node, a gate electrode to which the carry signal is applied from the previous signal transmission unit, and a second electrode to which the second low potential voltage of the second low potential voltage line GVSS2 is applied.

The output unit 63 may include a first output unit 63-1 and a second output unit 63-2.

The first output unit 63-1 may output a scan signal SCOUT(n) to a first output node based on the potentials of the Q node Q and the Qb node Qb. The first output unit 63-1 may include a first pull-up transistor T6 and a first pull-down transistor T7. The SCOUT(n) is Nth scan output and COUT (n) is Nth carry output of gate driver circuit shown in FIG. 11. SCOUT(n) is also labelled SC_OUT(n) in some figures and various places in this specification and is the same signal. This signal is provided as the SCAN signal to each respective pixel as shown in all figures having a SCAN signal as an input, including 3, 6, 7A1-7B2, 9, 10 and other figures.

The first pull-up transistor T6 and the first pull-down transistor T7 charge and discharge the first output node according to the voltages of the Q node Q and the Qb node Qb to output the scan signal SCOUT(n). The first pull-up transistor T6 includes a gate electrode connected to the Q node Q, a first electrode to which a first clock signal SCCLK(n) is applied, and a second electrode connected to the first output node. The first pull-down transistor T7 is connected to the first pull-up transistor T6 with the first output node therebetween. The first pull-down transistor T7 includes a gate electrode connected to the Qb node Qb, a first electrode connected to the first output node, and a second electrode connected to the first low potential voltage line GVSS0.

The second output unit 63-2 may output a carry signal COUT(n) to a second output node based on the potentials of the Q node Q and the Qb node Qb. The second output unit 63-2 may include a second pull-up transistor T6cr and a second pull-down transistor T7cr.

The second pull-up transistor T6cr and the second pull-down transistor T7cr charge and discharge the second output node according to the voltages of the Q node Q and the Qb node Qb to output the carry signal COUT(n). The second pull-up transistor T6cr includes a gate electrode connected to the Q node Q, a first electrode to which a second clock signal CRCLK(n) is applied, and a second electrode connected to the second output node. The second pull-down transistor T7cr is connected to the second pull-up transistor T6cr with the second output node therebetween. The second pull-down transistor T7cr includes a gate electrode connected to the Qb node Qb, a first electrode connected to the second output node, and a second electrode connected to the second low potential voltage line GVSS2.

Referring to FIG. 13, the gate driver according to the embodiment applies the line selection signal (LSP) to the pixel line to be selected according to the output timing of the carry signal to charge the M node when driving in the display mode, that is, before the sensing mode is driven.

When driving in the sensing mode, the pixel line is selected by applying the sensing start signal RESET signal to output the scan signal by the sensing start signal and the charging voltage of the M node.

FIGS. 14A to 14D are views illustrating a case in which the pixel line is selected by the line selection signal.

Figure 14A:
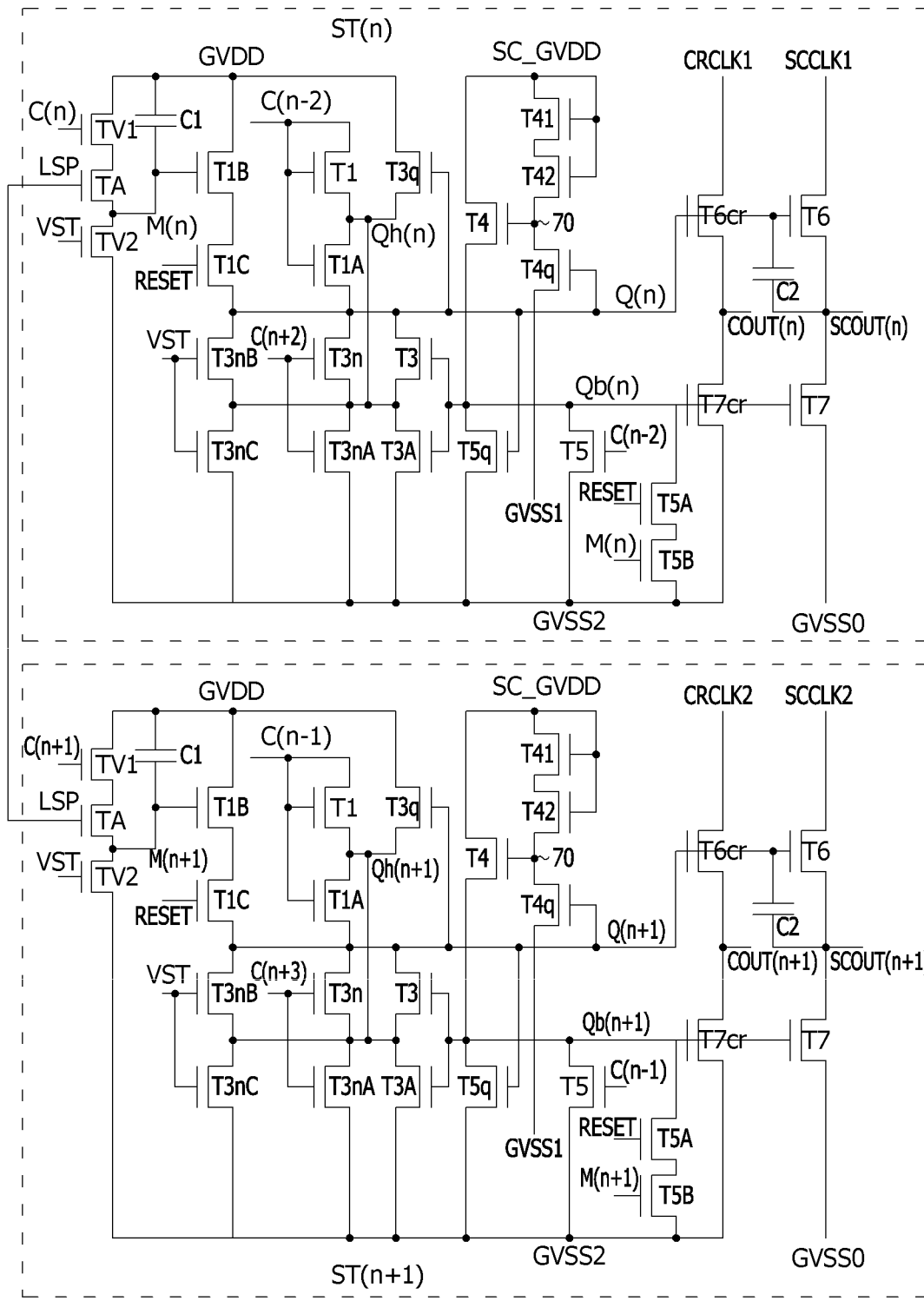
FIGS. 14A to 14D show a circuit and waveforms at various nodes in the circuit illustrating a case in which a pixel line is selected by a line selection signal.
Figure 14B:
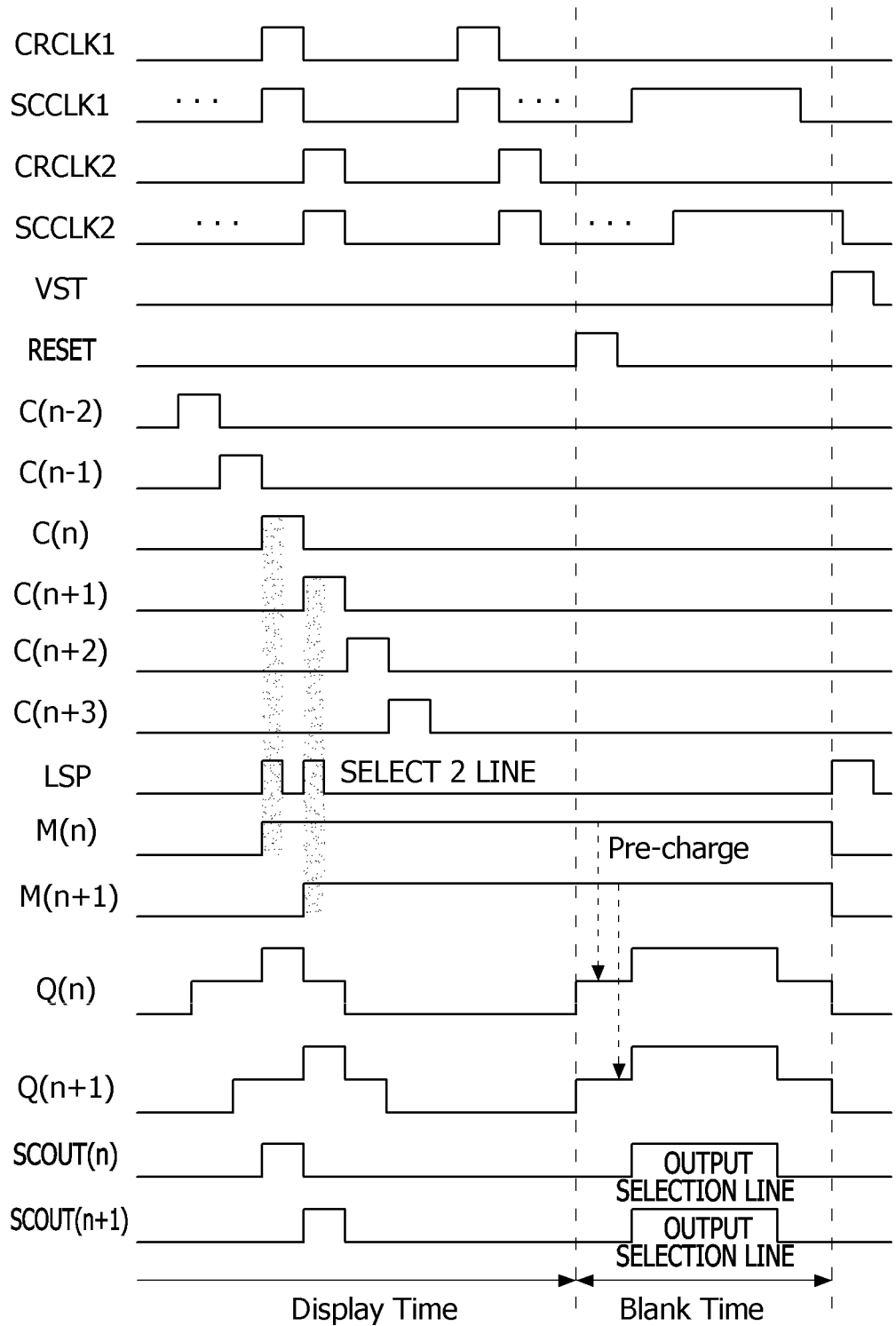

Referring to FIGS. 14A and 14B, a case in which two pixel lines are selected by the line selection signal in two signal transmission units ST(n) and ST(n+1) is shown. As shown in FIG. 14A, since the M node is charged to the high potential voltage, when the line selection signal is applied before the sensing mode is driven, M nodes M(n) and M(n+1) of each signal transmission unit are sequentially charged, and when the sensing start signal RESET is applied when driving in the sensing mode, the pixel lines may be simultaneously selected by outputting the scan signal according to sensing start signals and charging voltages of the M nodes M(n) and M(n+1).

Here, an example in which two pixel lines are selected is described, but the present disclosure is not limited thereto, and three or more pixel lines may be selected.

Figure 14C:
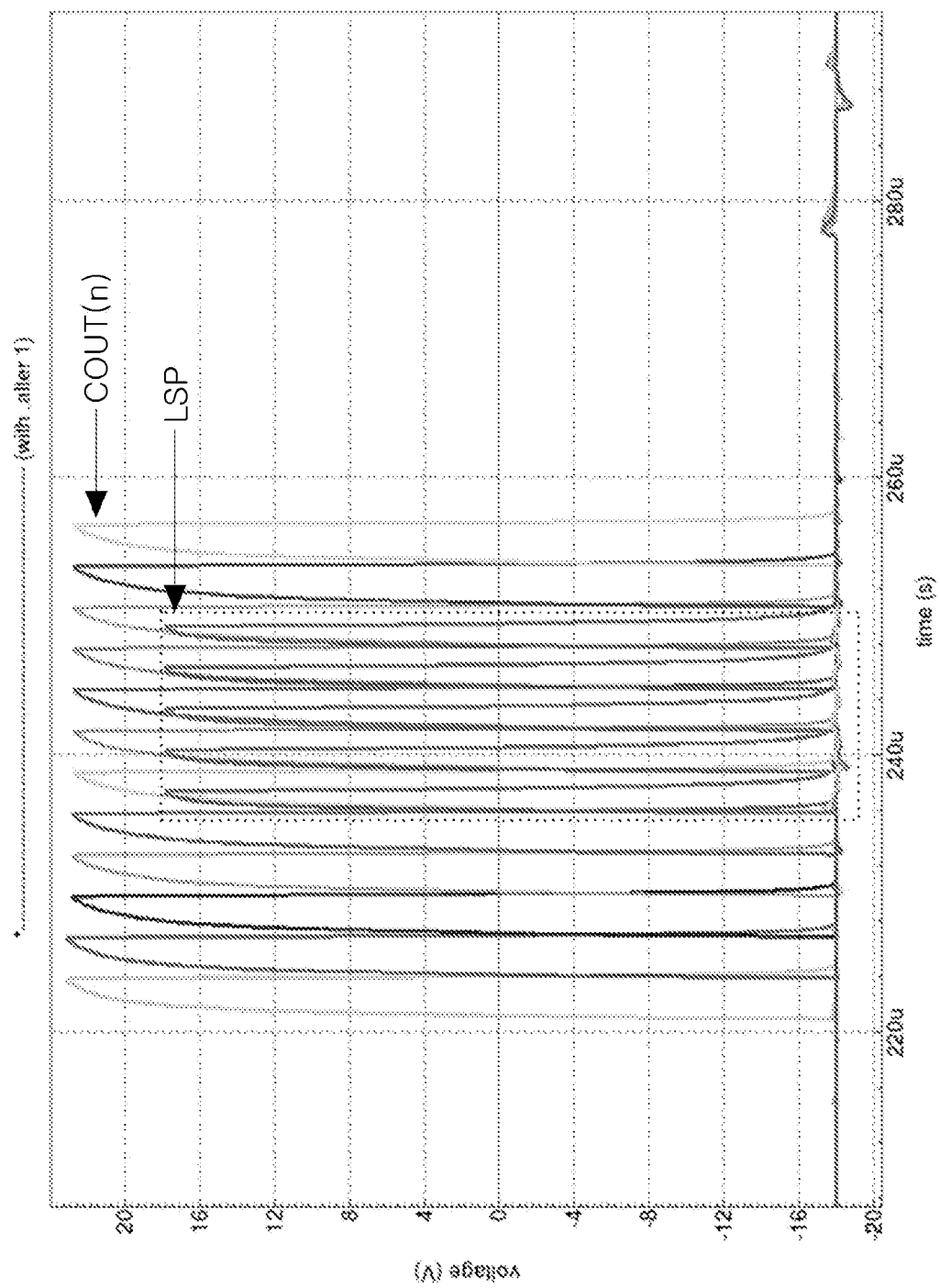

Referring to FIG. 14C, the signal transmission unit according to the embodiment may apply the line selection signal LSP according to the timing of the carry signal COUT(n) of the pixel line to be sensed before the sensing mode is driven. On the graph of FIG. 14C, the voltage of the carry signal COUT(n) and the line selection signal LSP is shown on the y axis that is plotted over time, shown on the x axis.

Figure 14D:
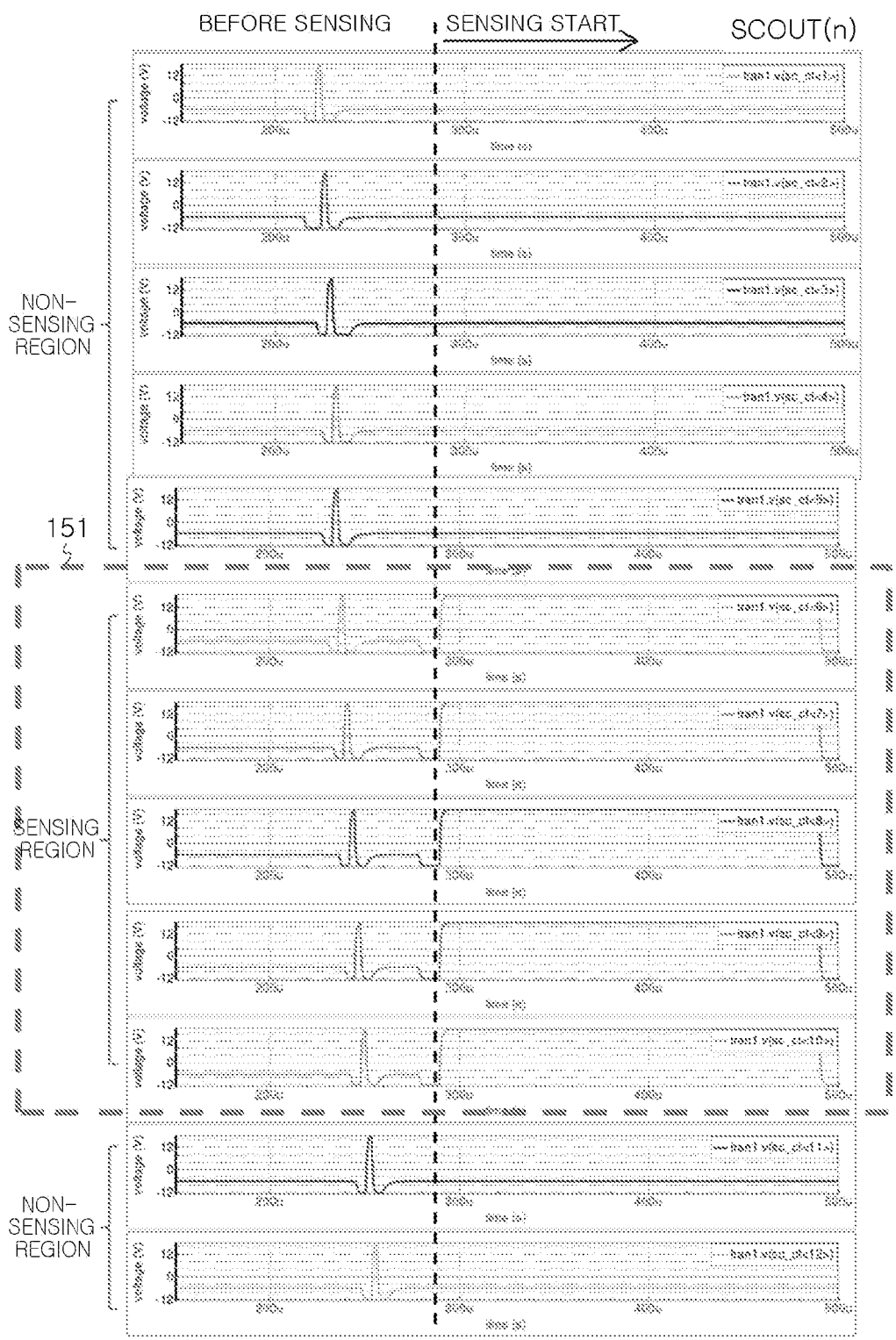

Here, a case in which the line selection signal is applied according to the output timing of some carry signals while 12 carry signals are sequentially output is shown. A case in which the line selection signal is applied according to the output timing of the sixth to tenth carry signals is shown. Referring to FIG. 14D, as shown in FIG. 14C, since the M node is charged by the line selection signal applied according to the output timing of the carry signal, when driving in the sensing mode, the scan signal SCOUT(n) is applied at a high voltage level to the corresponding pixel lines by the five signal transmission units within a sensing region of the dashed box 151 of which the M nodes are charged, and thus the corresponding pixel lines are selected, and the scan signal SCOUT(n) is applied at a low-level voltage to the remaining pixel lines by the seven signal transmission units within a non-sensing region of which the M nodes are not charged, and thus the corresponding pixel lines may not be selected. On each graph of FIG. 14D, the voltage of the scan signal SCOUT(n) on the y axis is shown plotted over time on the x axis. The voltage This SCOUT is applied as the SCAN signal to transistors M01 and M02 as shown in various Figures, including FIG. 7A1. As shown in FIGS. 14B and 14C, the five signal transmission units selected by the five carry signal and the five LSP signal outputs a scan signal with a high level voltage.

Figure 15:
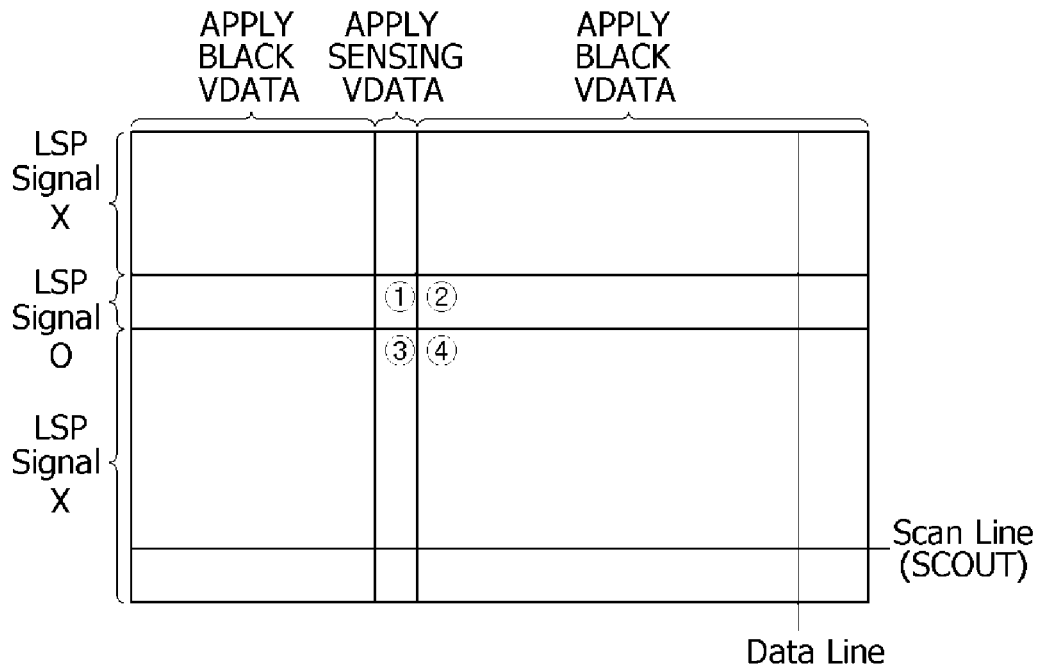
FIG. 15 is a view for describing a principle of selecting a sensing region from pixel lines.

FIG. 15 is a view for describing a principle of selecting the sensing region from the pixel lines.

Referring to FIGS. 11 and 15, the signal transmission unit according to the embodiment charges the M node to the high potential voltage when the line selection signal LSP is applied before the sensing mode is driven, and the pixel lines may be selected by applying the scan pulse of a high voltage level by the sensing start signal RESET to the pixel lines when driving in the sensing mode.

However, since the signal transmission unit may not charge the M node unless the line selection signal is applied before the sensing mode is driven, the scan pulse of a low-level voltage is applied to the pixel line by the sensing start signal when driving in the sensing mode, and thus the corresponding pixel lines may not be selected.

Like the above, in the embodiment, the pixel lines to be sensed may be selected by the line selection signal. Charging the M node prior to a sensing mode (before applying a sensing start signal RESET) is an advantage of the gate driver circuit in FIG. 11 that allows driving more than one pixel during the sensing mode. By starting the sensing mode (by applying the RESET signal to the gate drive circuit) the Q node Q is coupled to the M node. Thus, the Q node Q has a pre-charged voltage level of the M node prior driving the output stage. This pre-charged value allows the Q node Q to provide a sufficient power for a plurality of pixels. As a result, the present embodiment provides the benefit of a concurrent sensing of a plurality of lines of a display device while bypassing the light emitting elements of the plurality of pixels.

A sensing region (①) may be selected from the pixel lines selected by the line selection signal, and the sensing region is selected by applying sensing data. The sensing data is applied to sub-pixels located on the pixel lines, and a region including the sub-pixels to which the sensing data is applied is selected as the sensing region. Since the driving element is turned on by the sensing data, the current may flow through the pixel driving voltage line. In this case, since all switch elements are turned on by the scan pulse of the high voltage level, the current path is not formed by the light-emitting element and bypasses the light-emitting element, and thus no light is emitted in the sensing mode.

Accordingly, the current flowing through the pixel driving voltage line may be sensed in the sensing region (②).

Further, since the black data rather than the sensing data is applied to the sub-pixels located in a non-sensing region (②) not the sensing region (②), in the pixel lines selected by the line selection signal and thus the driving element is turned off, no current flows through the pixel driving voltage line.

Accordingly, the current flowing through the pixel driving voltage line may not be sensed in the non-sensing region (②).

On the other hand, when the pixel lines not selected by the line selection signal are connected to the data line passing through the sensing region (①)(③), since the switch elements are turned off by the scan signal of the low-level voltage even when the sensing data is applied like the sub-pixels located in the sensing region (①), no current flows through the pixel driving voltage line.

Accordingly, the current flowing through the pixel driving voltage line may not be sensed in a non-sensing region (③).

Further, when the pixel lines not selected by the line selection signal are connected to the data line passing through the non-sensing region (②)(④), the black data is applied like the sub-pixels located in the non-sensing region (②) and no current flows through the pixel driving voltage line.

Accordingly, the current flowing through the pixel driving voltage line may not be sensed in a non-sensing region (④).

Like the above, in the embodiment, the sensing region in the pixel line may be selected by applying the sensing data.

Figure 16:
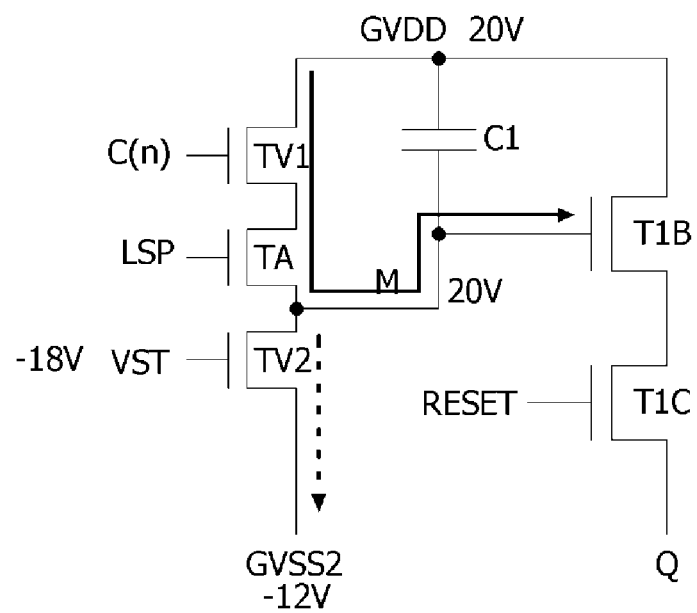
FIG. 16 is a view for describing a principle of preventing a leakage current of the line selection unit shown in FIG. 10.

FIG. 16 is a view for describing a principle of preventing a leakage current of the line selection unit shown in FIG. 10. All transistors used in the gate driver according to the embodiment are oxide TFTs, and a circuit stability margin is required according to a threshold voltage negative shift due to the characteristics of oxide TFTs. Hereinafter, a circuit stabilization method according to the threshold voltage negative shift will be described.

Referring to FIG. 16, the line selection unit according to the first embodiment of the present disclosure may include the first transistor TV1, the second transistor TA, the third transistor TV2, the fourth transistor T1B, and the fifth transistor T1C.

A pre-charge state should be maintained in the M node after selecting the scan line or the pixel line using the line selection signal LSP. Even when the third transistor TV2 is negatively shifted using a voltage lower than the second low potential voltage as the low voltage level of the start pulse, a leakage current of the M node may be prevented.

For example, the high potential voltage may be 20V, the low voltage level of the start pulse may be −18V, and the second low potential voltage may be −12V.

When both the low voltage level of the start pulse and the second low potential voltage are equally −12V, since a leakage current in which the voltage of the M node leaks toward the second low potential voltage is generated when the third transistor TV2 is even slightly negatively shifted by light or dispersion, abnormal driving of the circuit may occur.

However, when the low voltage level of the start pulse of −18V lower than the second low potential voltage is used, the threshold voltage of the third transistor TV2 has a margin of 6V, and it may be robust against leakage.

FIG. 17 is a view illustrating a gate driver according to a second embodiment of the present disclosure.

Referring to FIG. 17, the gate driver according to the second embodiment of the present disclosure may include a first control node which pulls up an output voltage (hereinafter referred to as a "Q node"), a second control node which pulls down an output voltage (hereinafter referred to as a "Qb node"), a line selection unit 61, a circuit unit 62, and an output unit 63.

Since the gate driver according to the second embodiment has the same configuration and function as the gate driver according to the first embodiment shown in FIG. 11, and only the line selection unit has a different configuration, only this will be described. The additional power provided by carrying out the pre-charge state of the M node permits the gate driver circuit of FIGS. 11 and 17 to be used to perform concurrent sensing of characteristics of multiple lines and multiple pixels.

A line selection unit 61 may include a first transistor TV1, a second transistor TA, a third transistor TV2, a fourth transistor T1B, a fifth transistor T1C, a sixth transistor TV3, a seventh transistors T3qA, and a first capacitor C1.

The first transistor TV1 is turned on by a carry signal C(n) and charges an M node to a high potential voltage of a high potential voltage line GVDD together with the second transistor TA. The first transistor TV1 includes a first electrode connected to the high potential voltage line GVDD, a gate electrode to which the carry signal C(n) is applied, and a second electrode connected to a first electrode of the second transistor TA.

The second transistor TA is turned on by a line selection signal (line select pulse, LSP) and charges the M node to the high potential voltage of the high potential voltage line GVDD together with the first transistor TV1. The second transistor TA includes the first electrode connected to the second electrode of the first transistor TV1, a gate electrode to which the line selection signal is applied, and a second electrode connected to the M node.

The third transistor TV2 is turned on by a start signal VST and discharges the M node to a low potential voltage of a second low potential voltage line GVSS2 together with the sixth transistor TV3. The third transistor TV2 includes a first electrode connected to the M node, a gate electrode to which a start signal is applied, and a second electrode connected to a first electrode of the sixth transistor TV3.

The fourth transistor T1B is turned on by the M node and charges the Q node Q to the high potential voltage of the high potential voltage line GVDD together with the fifth transistor T1C. The fourth transistor T1B includes a first electrode connected to the high potential voltage line GVDD, a gate electrode connected to the M node, and a second electrode connected to a first electrode of the fifth transistor T1C.

The fifth transistor T1C is turned on by a sensing start signal RESET and charges the Q node Q to the high potential voltage of the high potential voltage line GVDD together with the fourth transistor T1B. The fifth transistor T1C includes the first electrode connected to the second electrode of the fourth transistor T1B, a gate electrode to which the sensing start signal RESET is applied, and a second electrode connected to the Q node Q.

The sixth transistor TV3 is turned on by the start signal VST and discharges the M node to the low potential voltage of the second low potential voltage line GVSS2 together with the third transistor TV2. The sixth transistor TV3 includes the first electrode connected to the second electrode of the third transistor TV2, a gate electrode to which the start signal VST is applied, and a second electrode connected to the second low potential voltage line GVSS2.

The seventh transistor T3qA may be turned on by the voltage of the M node, and the high potential voltage may be applied to the second electrode of the third transistor TV2 and the first electrode of the sixth transistor TV3.

The first capacitor C1 is connected between the high potential voltage line GVDD and the M node, and stores the high potential voltage applied to the M node.

Figure 18:
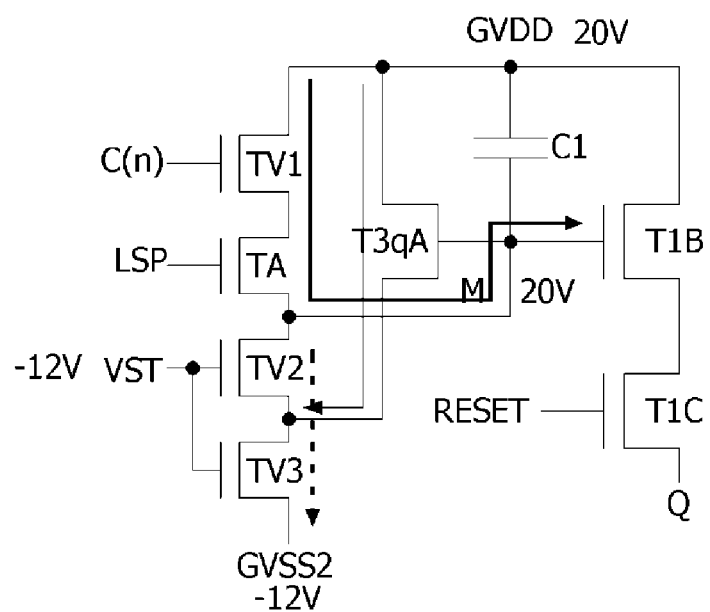
FIG. 18 is a view for describing a principle of preventing a leakage current of a line selection unit shown in FIG. 17.

FIG. 18 is a view for describing a principle of preventing a leakage current of the line selection unit shown in FIG. 17.

Referring to FIG. 18, the line selection unit according to the second embodiment of the present disclosure may include the first transistor TV1, the second transistor TA, the third transistor TV2, the fourth transistor T1B, the fifth transistor T1C, the sixth transistor TV3, the seventh transistor T3qA, and the first capacitor C1.

After selecting a scan line or a pixel line using the line select signal, the pre-charge state should be maintained at the M node. Since the gate driver according to the second embodiment additionally configures the sixth transistor TV3 and the seventh transistor T3qA, a leakage current in which the voltage of the M node leaks toward the second low-potential power line GVSS2 does not occur even when a negative shift of the third transistor TV2 occurs.

For example, the high potential voltage may be 20V, a low voltage level of a start pulse may be −12V, and the second low potential voltage may be −12V.

When the M node is charged, since the seventh transistor T3qA increases the voltage of a source node of the third transistor TV2 and thus a gate-source voltage Vgs of the third transistor TV2 is sufficiently shown as (−) due to an increase in voltage of the source node of the third transistor TV2 even when the negative shift occurs in the third transistor TV2 due to light or dispersion, the leakage current to the second low-potential power line GVSS2 does not occur and thus it may be robust against leakage.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a plurality of pixels, each pixel having a light emitting element, a data switching transistor, a drive transistor, and a bypass switching transistor; and
a gate driver circuit having an output coupled to a gate of the data switching transistor and the bypass switching transistor, the gate driver circuit including:
a line selection circuit having a first node, the line selection circuit configured to pre-charge the first node towards a first voltage supply during a display mode based on a line selection input and configured to charge a second node towards the first voltage supply during a sensing mode based on a voltage present on the first node; and
an output circuit coupled to the second node and configured to provide an output to drive one or more transistors of one or more of the plurality of pixels for sensing characteristics of the respective pixels during the sensing mode.

2. The display device of claim 1, wherein one of the characteristics of the respective pixels sensed during the sensing mode includes characteristics of a current flow in the drive transistor.

3. The display device of claim 1, wherein each of the plurality of pixels includes:

a driving element including a first electrode to which a pixel driving voltage is applied, a gate electrode connected to a first node, and a second electrode connected to a second node;
a first switch element including a first electrode to which a data voltage is applied, a gate electrode to which a scan pulse is applied, and a second electrode connected to the first node;
a second switch element including a first electrode connected to the second node, a gate electrode to which the scan pulse is applied, and a second electrode to which a reference voltage is applied;
a light-emitting element including an anode connected to the second node and a cathode to which a low potential power voltage is applied; and
a capacitor connected between the first node and the second node.

4. The display device of claim 3, wherein the data voltage includes a sensing data voltage and a black data voltage, and
the first switch element and the second switch element are turned on, and the sensing data voltage is applied in the case of a sensing region of a pixel line selected according to the sensing mode.

5. The display device of claim 4, wherein the first switch element and the second switch element are turned off, and the sensing data voltage is applied in the case of a pixel line not selected according to the sensing mode and connected to a data line passing through the sensing region.

6. The display device of claim 4, wherein the first switch element and the second switch element are turned on, and the black data voltage is applied in the case of a non-sensing region of the pixel line selected according to the sensing mode.

7. The display device of claim 6, wherein the first switch element and the second switch element are turned off, and the black data voltage is applied in the case of a pixel line not selected according to the sensing mode and is connected to a data line passing through the non-sensing region.

8. A display device comprising,
a plurality of pixels, each pixel having a light emitting element, a data switching transistor, a drive transistor, and a bypass switching transistor; and
a gate driver circuit having an output coupled to a gate of the data switching transistor and the bypass switching transistor, the gate driver circuit including:
a line selection circuit having a first node, the line selection circuit configured to pre-charge the first node to a first voltage during a display mode based on a line selection input and configured to charge a second node during a sensing mode based on a voltage of the first node; and
an output circuit coupled to the second node and configured to provide an output to drive one or more transistors of one or more of the plurality pixels for sensing characteristics of the respective pixels during the sensing mode,
wherein the line selection circuit includes:
a first transistor coupled to the first voltage supply and having its gate controlled by a carry signal associated with a selected line to be sensed.

9. A method comprising:
selecting a plurality of lines to be sensed concurrently, each line of the plurality of lines having a plurality of pixels coupled to it, a first line of the plurality of lines is driven by a gate drive circuit that includes a line selection circuit;

pre-charging a first node of the line selection circuit to a first voltage supply during a display mode;

charging a second node of a driving circuit in the gate drive circuit towards the first voltage supply by coupling the first node to a gate of transistor whose output is coupled to the second node in response to a sensing start signal during a current sensing mode;

coupling the second node to an output circuit of the gate drive circuit; and generating a control signal from the output circuit during the current sensing mode, the control signal switching on a bypass transistor in each selected pixel of the plurality of pixels coupled to the first line to bypass light emitting elements within the plurality of pixels during the current sensing mode.

10. A display device comprising:

a plurality of pixels, each pixel having a light emitting element, a data switching transistor, a drive transistor, and a bypass switching transistor; and a gate driver circuit having an output coupled to a gate of the data switching transistor and the bypass switching transistor, the gate driver circuit including:

a line selection circuit having a first node, the line selection circuit configured to pre-charge the first node to a first voltage during a display mode based on a line selection input and configured to charge a second node during a sensing mode based on a voltage of the first node; and an output circuit coupled to the second node and configured to provide an output to drive one or more transistors of one or more of the plurality of pixels for sensing characteristics of the respective pixels during the sensing mode, wherein the line selection circuit includes:

a first transistor coupled to a first voltage supply and controlled by a carry signal associated with a selected line to be sensed; and a second transistor coupled between the first transistor and the first node, the second transistor is controlled by a line selection signal, the first and second transistors are in series, and the first voltage supply is coupled to the first node when the carry signal and the line selection signal are concurrently at a high voltage level.

11. The display device of claim 10, wherein the line selection circuit further includes:

a third transistor coupled to the first voltage supply and controlled by the first node; and a fourth transistor coupled between the third transistor and the second node, the fourth transistor is controlled by a sensing start signal, the third and fourth transistors are in series, and the first voltage supply is coupled to the second node when the first node and the sensing start signal are concurrently at a high voltage level.

12. The display device of claim 11, wherein the line selection circuit further includes a fifth transistor coupled between the first node and a first reference potential node, the fifth transistor is controlled by a start signal, a voltage of the first reference potential node is lower than the first voltage supply, and the first node is discharged through the fifth transistor when the start signal at a high voltage level.

13. The display device of claim 12, wherein the line selection circuit further includes:

a sixth transistor coupled between the fifth transistor and the first reference potential node, the fifth and sixth transistors are controlled by the start signal; and a seventh transistor coupled between the first voltage supply and the sixth transistor, the seventh transistor is controlled by the first node.

14. The display device of claim 13, wherein the gate driver circuit includes:

a first stage to charge and discharge the second node during the display mode; and a second stage having a third node, the third node being in a reverse logical level of the second node, the second node driving a pull-up circuit of the output circuit and the third node driving a pull-down circuit of the output circuit, and the third node being discharged during the sensing mode.

15. The display device of claim 14, wherein the first stage of the gate driver circuit includes:

a first-a transistor coupled between the second node and a fourth node, the fourth node charging the second node during the display mode; and a second-a transistor coupled between the fourth node and the first reference potential node, the first-a and second-a transistors are controlled by the start signal, and the second and fourth nodes are discharged through the first-a and second-a transistors when the start signal is at a high voltage level.

16. The display device of claim 15, wherein the first stage of the gate driver circuit further includes:

a third-a transistor coupled in parallel to the first-a transistor, and a fourth-a transistor coupled in parallel to the second-a transistor, the third-a and fourth-a transistors are controlled by a N+2th carry signal; and a fifth-a transistor coupled in parallel to the first-a transistor, and a sixth-a transistor coupled in parallel to the second-a transistor, the fifth-a and sixth-a transistors are controlled by the third node.

17. The display device of claim 16, wherein the first stage of the gate driver circuit further includes:

a seventh-a transistor coupled between a N-2th carry signal and the fourth node, and an eighth-a transistor coupled between the fourth node and the second node, the seventh-a and eighth-a transistors are controlled by the N-2th carry signal; and a ninth-a transistor coupled between the first voltage supply and the fourth node, the ninth-a transistor is controlled by the second node.

18. The display device of claim 17, wherein the second stage of the gate driver circuit includes:

a first-b transistor coupled between a second voltage supply and the third node, the first-b transistor is controlled by a fifth node; and a second-b transistor coupled between the third node and the first reference potential node, the second-b transistor is controlled by the second node.

19. The display device of claim 18, wherein the second stage of the gate driver circuit further includes:

a third-b transistor coupled in series to a fourth-b transistor, the third-b and fourth-b transistors are coupled between the second voltage supply and the fifth node and are controlled by the second voltage supply; and a fifth-b transistor coupled between the fifth node and a second reference potential node, the fifth-b transistor is controlled by the second node.

20. The display device of claim 19, wherein the second stage of the gate driver circuit further includes:

a sixth-b transistor coupled between the third node and the reference potential node, the sixth-b transistor is controlled by the N-2th carry signal; and a seventh-b transistor coupled in series to an eighth-b transistor, the seventh-b and eighth-b transistors are coupled between the third node and the reference potential node, the seventh-b transistor is controlled by the sensing start signal, and the eighth-b transistor is controlled by the first node.

21. The display device of claim 20, wherein the output circuit includes:
a first stage to drive a carry out signal during the display mode, the first stage is controlled by a first clock; and
a second stage to drive a scan out signal during both the display mode and the sensing mode, the second stage is controlled by a second clock, the first and second stages include the pull-up circuit coupled to the second node and the pull-down circuit coupled to the third node, and the first clock is off during the sensing mode while the second clock is on.

* * * * *

UNITED STATES PATENT AND TRADEMARK OFFICE
CERTIFICATE OF CORRECTION

PATENT NO. : 11,830,441 B2
APPLICATION NO. : 17/861027
DATED : November 28, 2023
INVENTOR(S) : Ki Won Son et al.

It is certified that error appears in the above-identified patent and that said Letters Patent is hereby corrected as shown below:

In the Claims

Column 22, Claim 8, Line 55:
"the plurality pixels for"
Should be:
--the plurality of pixels for--.

Signed and Sealed this
Fourth Day of June, 2024

Katherine Kelly Vidal
*Director of the United States Patent and Trademark Office*